United States Patent [19]
Baggen et al.

[11] Patent Number: 5,872,798
[45] Date of Patent: Feb. 16, 1999

[54] ERROR CORRECTABLE DATA TRANSMISSION METHOD AND DEVICE BASED ON SEMI-CYCLIC CODES

[75] Inventors: Constant P.M.J. Baggen; Ludovicus M.G.M. Tolhuizen, both of Eindhoven, Netherlands

[73] Assignee: U.S. Philips Corporation, New York, N.Y.

[21] Appl. No.: 535,155

[22] PCT Filed: Feb. 14, 1995

[86] PCT No.: PCT/IB95/00100

§ 371 Date: Oct. 16, 1995

§ 102(e) Date: Oct. 16, 1995

[87] PCT Pub. No.: WO95/23384

PCT Pub. Date: Aug. 31, 1995

Related U.S. Application Data

[63] Continuation-in-part of Ser. No. 304,000, Sep. 9, 1994, abandoned.

[30] Foreign Application Priority Data

| Feb. 16, 1994 | [EP] | European Pat. Off. | 94200336 |
| Feb. 23, 1994 | [EP] | European Pat. Off. | 94200452 |
| Mar. 21, 1994 | [EP] | European Pat. Off. | 94200703 |
| Jun. 24, 1994 | [EP] | European Pat. Off. | 94201824 |
| Nov. 22, 1994 | [EP] | European Pat. Off. | 94203394 |

[51] Int. Cl.$^6$ .................................................. H03M 13/00
[52] U.S. Cl. ........................................ 371/37.4; 371/37.5
[58] Field of Search .................................. 371/37.7, 38.1, 371/39.1, 40.1, 40.2, 40.3, 37.11, 37.2, 37.3, 37.4, 37.5, 37.6

[56] References Cited

U.S. PATENT DOCUMENTS

| 4,356,564 | 10/1982 | Doi et al. | 371/40 |
| 4,398,292 | 8/1983 | Doi et al. | 371/39.1 |
| 4,438,464 | 3/1984 | Odaka | 360/13 |
| 4,477,940 | 10/1984 | Will | 15/250.35 |
| 4,546,474 | 10/1985 | Sako et al. | 371/39.1 |
| 4,598,403 | 7/1986 | Odaka | 371/39.1 |
| 4,683,572 | 7/1987 | Baggen | 371/37.5 |
| 5,060,221 | 10/1991 | Sako et al. | 369/59 |

*Primary Examiner*—Emmanuel L. Moise
*Attorney, Agent, or Firm*—Debra K. Stephens; Bernard Franzblau

[57] ABSTRACT

Data rate and robustness of digital error protection is improved according to the method and device of the present invention to obviate the need for audio interpolation and consequently, to be useful in fields where audio interpolation cannot be done without complex encoding and decoding strategies. Digital information signals are transferred in the form of a plurality of a number of sequences of information symbols. Each information symbol has a uniform bit length and each sequence of information symbols occurs in a respective input channel. Check words are included in transmitted digital information signals and are encoded to allow correction of erroneous symbols caused on transmission.

21 Claims, 11 Drawing Sheets

|     |     |     |     | 40 | 42 | 44 | 46 |     |
|-----|-----|-----|-----|----|----|----|----|-----|
|     |     |     |     | 0  | 0  | 0  | 0  | 0   |
|     |     |     |     | 0  | 0  | 0  | 0  | 0   |
| 25  |     |     |     | 0  | 0  | 0  | 0  | 0   |
| 26  |     |     |     | 0  | d  | 0  | 0  | 0   |
| 28  |     |     |     | 0  | c  | ed | 0  | 0   |
| 30  |     |     |     | 0  | b  | ec | df | 0   |
| 32  |     |     |     | 0  | a  | eb | cf | 0   |
| 34  |     |     |     | 0  | 1  | ea | bf | 0   |
| 36  |     |     |     | 0  | 0  | e  | af | 0   |
| 38  |     |     |     | 0  | 0  | 0  | f  | 0   |

|   | 7 | 4  |
|---|---|----|
| 6 | 0 | P  |
| 2 | Q | QP |

PRIOR ART

FIG.4

ERROR CORRECTABLE DATA TRANSMISSION METHOD AND DEVICE BASED ON SEMI-CYCLIC CODES

CROSS-REFERENCE TO RELATED APPLICATION

This is a continuation-in-part of application Ser. No. 08/304,000, filed Sep. 9, 1994, now abandoned.

BACKGROUND OF THE INVENTION

Field of the Invention

The invention relates to a method for transmitting a digital information signal in the form of a plurality of a sequences of information symbols, each symbol having a uniform bit length and each such sequence of symbols occurring in a respective input channel, check words being included in the transmitted signal as a result of encoding to enable correction of erroneous symbols caused by said transmitting, the method includes:

applying a first block of s symbols, one from each such input channel, in a first arranging state to a first error correcting encoder to generate p first check symbols. Additionally each symbol is delayed in said first block and each of the p first check symbols by a respective different delay time to provide a resulting second block of symbols in a second arranging state. The second block of symbols is applied to a second error correcting encoder to generate a q second check symbols, and the information symbols as well as the first and second check symbols are transmitted.

The invention also relates to a device for executing the method. Such method and device, and in particular a decoding strategy therefor, have been disclosed in U.S. Pat. No. 4,477,903 (Ref I) to the present Assignee; a further particular decoding strategy has been disclosed in U.S. Pat. No. 4,683,572 (Ref.II), again to the same Assignee as the present application. In particular, all codes used for the present invention are linear codes, so that the sum of two code words is again a code word. This also allows for explicitly or implicitly converting a code word of a systematic code into a code word of a non-systematic code and vice versa. Now, the references relate to the error protection of the well-known Compact Disc system for recording and transmitting high-quality audio signals. Various extensions of that system have been based on the above error protection technology. In most cases the digital error protection is sufficient to exactly reproduce the original digital input signal, whilst in case of reproduction of an audio signal, a last recourse can be found by masking uncorrectable errors through some kind of interpolation on the audio signal itself. Although the above system has been widely and successfully commercialized, a need for higher performance has been felt, in respect of attainable data rate as well as in respect of increased robustness against errors to be offered by the code itself.

SUMMARY OF THE INVENTION

Therefore it is inter alia an object of the present invention to improve both the data rate and the robustness of the digital error protection according to the cited reference in order to obviate the need for the above audio interpolation, and to improve the applicability in various other fields where such interpolation cannot be done, while at the same time keeping the encoding and decoding strategies as simple and effective as possible. In consequence, according to one of its aspects the invention is characterized in that said first and second check symbols are generated to satisfy a respective parity check matrix, each having s+p+q columns, but p and q rows, respectively, wherein p·q>1 of semi-cyclic codes, said delaying putting adjacent symbols of said first arranging state into uniformly-spaced instances of said second arranging state, and in that said q second check symbols are retro-coupled into said first error correcting encoder in accordance with said first arranging state. The specific properties of semi-cyclic codes will be discussed hereinafter.

The retro-coupling of the second check symbols places these symbols also under the protection of the first error correcting code. This extra protection has proven to be of great advantage to the overall error correction capability, in particular to correction of random symbol errors. One of the prime effects is that the lengths of the various code words may be increased, resulting in a lesser amount of overhead.

The invention also relates to a method for decoding with error correction, to a device for transmitting with error protection, to a device for decoding with error correction, and to a carrier provided with information spaced and disposed for application in conjunction with the above method and/or devices as specified in various claims. In particular, with respect to transmitting a finite sequence a trailing sequence of said first and second check symbols is generated by said delaying and retrocoupling and is limited to a series of s+q−1 first blocks comprising only notional information symbols. This produces a first code format that is applicable to separating data segments from each other, so that no code interactions occur.

Advantageously, said trailing sequence of first and second check symbols is overlayed through symbolwise addition to an initial sequence of first and second check symbols at a commencing part of said finite sequence, thereby realizing a cylindrical storage format. This is feasible through the use of linear codes and allows a shorter length format for the same amount of user data, such as expressible in physical carrier area.

It is advantageous for transmitting a finite sequence of said first blocks by first encoding all C2 code words that contain a symbol of the ultimate said first block in a preparing step and assigning the second check symbols of those C2 code words to the next q C1-code words, and by subsequently encoding all C1 code words and further C2 code words associated with said finite sequence of first blocks. This allows for earlier decoding of a so-called tail-up format in that no wrapping around is effected.

It is advantageous for transmitting a finite sequence of $m \geq s$ non-zero said first data blocks (in a cylinder format), by a: after executing parts 61, 62 and starting from an initial said first data block for each of $0 \leq y \leq m$ successive first data blocks first forming a C1 code word and next a C2 code word;

b1: for each data symbol of an ultimate said first data block, except for its last data symbol, forming an associated C2 code word;

b2: subtracting all symbols of a block of s rows and q columns of symbols so formed from data symbols correspondingly positioned in the initial q said first blocks of symbols;

c: after executing parts b1, b2 and starting from an ultimate said first data block for each of $0 \leq z=m-y \leq m$ successive first data blocks first forming a C2 code word and next a C1 code word;

d: after generating of parts a and c, generating a diamond shape containing p×q check symbols either through q C1 code words or through p C2 code words;

e: after executing part b1 and completing the q columns comprising exclusively check symbols including those of part b1, adding all symbols of those q columns to symbols correspondingly positioned in the initial q symbol columns, and subsequently suppressing said block of q check columns. This is a straight-forward encoding procedure.

It is advantageous for transmitting a finite sequence of $m \geqq s$ non-zero said first data blocks (in a cylinder format), by a: after executing parts 61, 62 and starting from an initial said first data block for each of $0 \leqq y \leqq m$ successive first data blocks first forming a C1 code word and next a C2 code word;

b1: for each data symbol of an ultimate said first data block, except for its last data symbol, forming an associated C2 code word;

b2: subtracting all symbols of a block of s rows and q columns of symbols so formed from data symbols correspondingly positioned in the initial q said first blocks of symbols;

c: after executing parts b1, b2 and starting from an ultimate said first data block for each of $0 \leqq z = m-y \leqq m$ successive first data blocks first forming a C2 code word and next a C1 code word;

d: after generating of parts a and c, generating a diamond shape containing p×q check symbols either through q C1 code words or through p C2 code words;

e: after executing part b1 and completing the q columns comprising exclusively check symbols including those of part b1, adding all symbols of those q columns to symbols correspondingly positioned in the initial q symbol columns, and subsequently suppressing said block of q check columns.

It is advantageous for transmitting a finite sequence of $m<s$ non-zero said first data blocks (in a cylinder format), by a: after executing parts b1, b2 and starting from an initial said first data block for each of $0 \leqq y \leqq m$ successive first data blocks first forming a C1 code word and next a C2 code word;

b1: for each data symbol of an ultimate said first data block, except for its last data symbol, forming an associated C2 code word, while of each C2 code word so formed that has a final data symbol at contiguous row to an initial data symbol of a subsequent C2 code word, superposing the check symbols of the former C2 code word on the check symbols of the latter C2 code word, during their being generated;

b2: subtracting all symbols of a block of s rows and q columns so formed from data symbols positioned on the same rows, in that from a data symbol in column j are subtracted, the check symbols in columns j+m, j+2m, etcetera, until all check symbols on the row in question have been subtracted one;

c: after executing parts b1, b2 and starting from an ultimate said first data block for each of $0 \leqq z = m-y \leqq m$ successive first data blocks first forming a C2 code word and next a C1 code word;

d: after generating of parts a and c, generating a diamond shape containing p×q check symbols either through q C1 code words or through p C2 code words;

e: after executing part b1, and completing the q columns comprising exclusively check symbols including those of part b1, adding all symbols of those q columns to symbols correspondingly positioned in the initial q symbol columns s, in the same manner and in point b2, and subsequently suppressing said block of q check columns. Further advantageous aspects are recited in dependent Claims.

BRIEF DESCRIPTION OF THE DRAWINGS

These and other aspects and advantages of the invention will be elucidated with reference to the disclosure of preferred embodiments hereinafter, and in particular with reference to the appended Figures; therein:

FIG. 2 explains of the so-called diamond code;

FIG. 4 shows a correspondence of the present code to a product code;

DESCRIPTION OF PREFERRED EMBODIMENTS

Hereinafter, first the basic solution according to the present invention is presented; next various additions, modifications and refinements are disclosed that could supplement the basic embodiment in various different combinations and/or effectively change one or more of its aspects in favour of a different solution generally falling within the same inventive concept. Each of the extras is denoted by a separate numeral. Generally, the parameter values are arbitrary.

Figure 1:
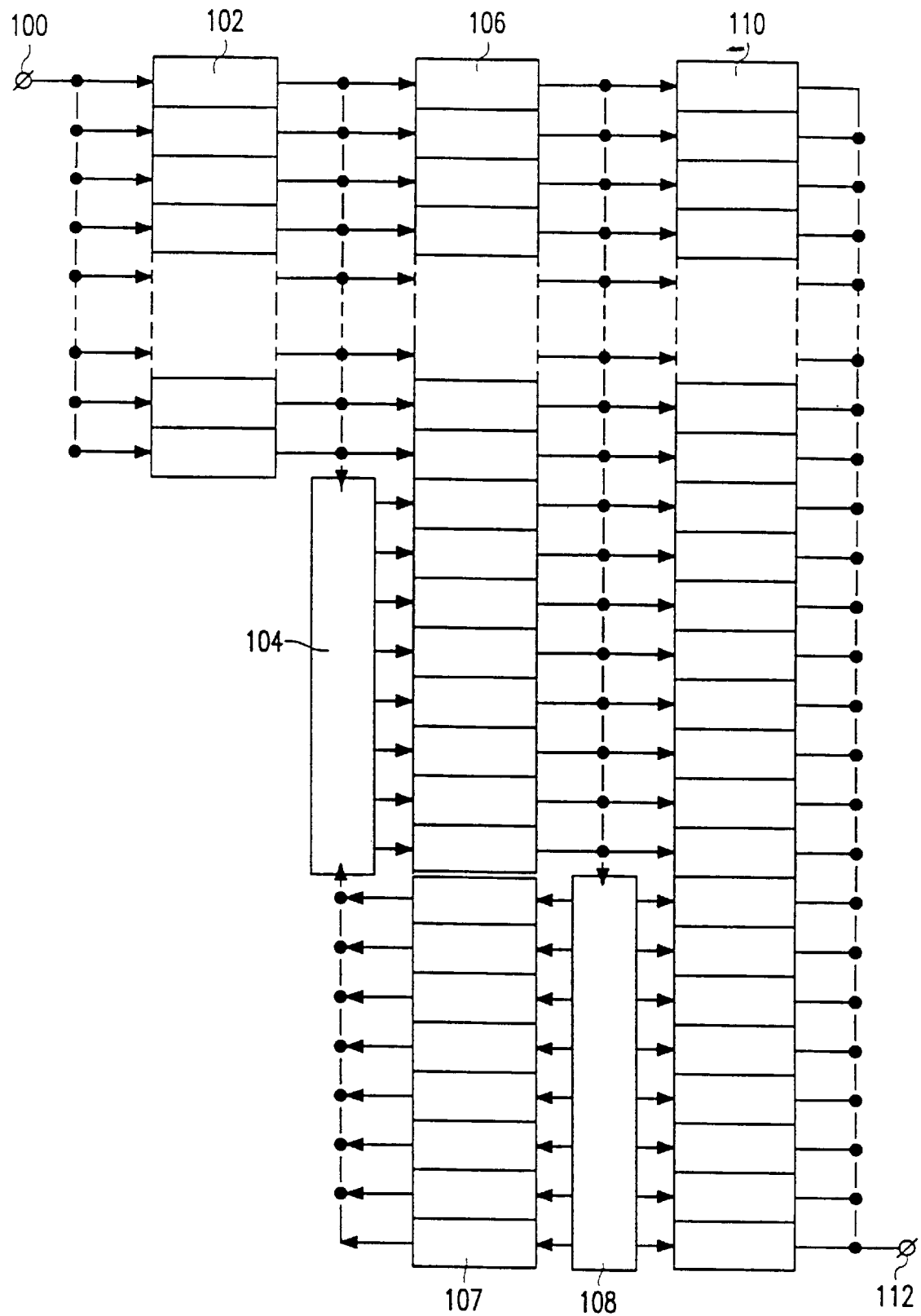
FIG. 1 shows an overall block diagram of an encoding device.

FIG. 1 shows an overall block diagram of an encoding device. The stream of data symbols arrives at input 100 which by way of example, may be 8 bits wide to accommodate eight-bit symbols. Block 102 is the input storage that takes up the symbols according to order of arrival, and according to a selection mechanism that assigns the symbols to appropriate channels. The delay allows the various symbols to be presented to the first encoder stage 104 at the correct instants. Note that the vertical input to the encoder 104 has been drawn as a single line. There is, however, no interaction between the various symbols before inputting. The encoder 104 needs to receive the incoming symbols at the same data rate as the input 100; for each data symbol received it determines the contribution thereby to the various preliminary first check symbols of the word of the first code to which the data symbol in question belongs. If necessary, it may calculate the contributions by the data symbols to preliminary check symbols of a cycle of first code words as applicable to the format shown in FIG. 9, infra, as an example. This situation applies if the symbols of a particular code word do not arrive contiguously, but are interspersed with symbols of one or more other words in a cyclic manner. Block 106 is the intermediate storage to align the data symbols and first check symbols for processing by a second encoder stage 108. Block 108 calculates in a similar way as the block 104, the second check symbols associated with the second code words. Block 110 is the output storage that takes up the data symbols and first and second check symbols for sequentially correct presentation to serial output 112. Upon generation in the encoder 108, the second check symbols are also retro-coupled, via delays 107, into the encoder 104 in which they also contribute to the appropriate first code word. As shown in the example, both first check symbols p and q second check symbols in FIG. 1 have the value 8. Generally, p·q>1. The value of s, the number of data or user symbols, is much larger, but a value of 118 gave good results. A higher degree of protection has been attained with s having a value of 52. The detailed timing will be discussed with respect to FIGS. 2 and 5–7.

FIG. 2 shows an explanation of the so-called diamond code. In the figure, each row represents a sequence of symbols, each symbol covering one of the squares, and each square being occupied by exactly one symbol. Usually, each symbol has eight bits, although this number is not an absolute restriction. The arrowed indications C1 and C2 indicate the positioning of the C1 code words and C2 code words, respectively: C1 words lie in a vertical direction and C2 words in a diagonal direction. All code words form part of a so-called semi-cyclic code or weakly cyclic. The definition of such a code C is as follows:

(0, c1, c2, ... cn–1)∈C<=>(c1, c2, ... cn–1, 0)∈C, or in words, if the n-symbol word at the left that starts with a symbol zero is a word of the code C, the word rotated over one symbol as shown, which word in consequence ends with a symbol zero, is also a word of the code C. Of course, words that start with a greater number of zeroes can be rotated over a relatively greater number of symbol positions. However, rotation in the other direction would not necessarily result in a code word. Various codes having the above property can be given but a conspicuous class is formed by the shortened Reed-Solomon codes that are also used in the references. A shortened BCH code is a more general code that also applies. In both codes, only an initial series of symbols is used as data or check symbols, whereas all later symbols are intrinsically zero. The unshortened Reed Solomon code is cyclic, which means that all possible rotations of its code words are again code words. Now, if the presently used code word begins or ends with a zero symbol, its rotation as shown is the formula is again a code word. This is the definition of semi-cyclic: generally, a shortened cyclic code is weakly cyclic. The word "weakly" implies that shortened cyclic codes are no longer fully cyclic.

In FIG. 2 the encoding is presumed to commence at the heavy vertical line, which means that to the left thereof only zeroes occur. These zeroes occur earlier in time as far as relevant to the encoding of this particular C1 word. The data symbols are assigned to a plurality of sequence as indicated by the reference 20. For clarity, only a few sequences thereof have been shown. Indication 22 refers to the four check symbols of each C1 code word. Indication 24 refers to the two check symbols of each C2 code word. These numbers are given by way of example only; in practice, the code words often have higher numbers of check symbols. Suppose that the first non-zero data symbol is the symbol d in row 26 and column 40 (symbol 2640). Encoding of the C1 code word that is positioned in column 40 yields the symbols c, b, a, 1, respectively as shown, symbol 3440 having the value 1 through normalization. It can be proven that with the semi-cyclic codes according to the invention the symbol 3440 cannot be zero. In the case of a Reed-Solomon code none of the symbols 2840, 3040 and 3240 can be equal to zero either. In the above normalization, all symbols are multiplied by a fixed factor, which, however, does not influence the reasoning hereinafter. The calculations are performed in a finite field GF(256), which can be represented by eight bits. Through the choice of the generator matrix, the C1 word so encoded leaves the symbols 3640 and 3840 equal to zero. Such word exists in a semi-cyclic code. Next, the C2 word that contains symbol 3440 is encoded; in this exemplary code with only two check symbols this yields symbols e(3642) and f(3844). For the present discussion, the specific values of e and f are inconsequential. Alignment of columns 40 and 42 implies rotation over one position in the vertical direction; according to the definition of semi-cyclic codes, supra, this produces again a word of the code, because symbol 3640 is now a zero. This property applies because all other symbols of columns 40, 42 are zero. This proves that in the Figure the contents of blocks 2842, 3042, 3242 and 3442 are ed, ec, eb, ea, respectively. A similar reasoning produces the contents of blocks 3044, 3244, 3444, 3644, as shown together constituting the non-zero part of the C1 word in column 44.

With the calculation of blocks 3642 and 3844, the contribution of block 3440 to the second check symbols has been fully taken into account. This means that none of the other non-zero blocks of column 40 as shown has any influence on blocks in columns other than columns 42, 44, as shown. The reason is again that due to the property of the semi-cyclic code, the C2 code-words along the diagonals after rotation over one position according to the above definition of semi-cyclic codes again have symbols that differ from the C2 word indicated by uniform factors a, b, c, and d, respectively. This proves that the influence of the non-zero symbol d (2640) is restricted to the parallelogram of symbol positions bordered by a heavy line. The width is one greater than the number of check symbols of the C2 code. The dimension along each column is also one greater than the number of check symbols of the C1 code. Because of the shape of the parallelogram, the code is called the diamond code. On the basis of the properties of the selected codes, the symbols 2640 and 3440 both differ from zero.

Now, another data symbol of column 40 may differ from zero, for example symbol 2540 which, through normalization by a predetermined factor, could again have the value d. It will be shown in which columns of second check symbols this non-zero symbol 2540 would have effects. First of all, shifting the diamond pattern of FIG. 2 upwards by one block would again give code words in all three columns 40, 42, 44, due to the semi-cyclic character of the code. Subtracting the shifted diamond pattern from symbol 2540 and from the check symbols caused thereby would render symbol 2540 equal to zero and probably symbols 2640 and 2642 non-zero. Symbol 2640 as proves would have no consequences farther to the right than column 44. Likewise, symbol 2642 would have no consequences farther than column 46. This proves that the influence of any data symbol is always restricted to a finite number of columns and, in consequence, the retro-coupling to block 104 described with respect to FIG. 1 does not cause instabilities in the encoding. For a number of s data symbols in a column and q check symbols of a second code word, a pattern results with a width of s+q columns.

The code format has been explained with C1 words running vertically and C2 words running from top left to bottom right. Likewise, C2 words may run from top right to bottom left, or from bottom right to top left, in the latter case preferably the check symbols are at the top. C1 words and C2 words may also interchange their directions. Various other possibilities through elementary changes are feasible.

Figure 3:
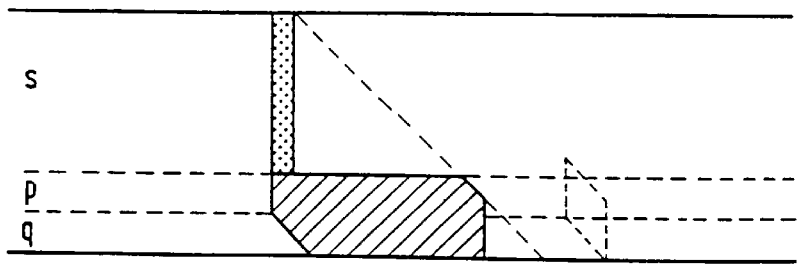
FIG. 3 shows a diamond code in systematic form.

FIG. 3 shows a diamond code in systematic form. There is a single grey column that contains s information symbols of arbitrary value. This causes p C1 check symbols in the same column that may be made non-zero through the encoding, as well as in subsequent columns. In the next q rows the non-zero C2 check symbols may occur only in the hatched region. The dotted line starting from the top symbol of the data column determines the slanted edge at the right hand side. The shape of the elementary diamond (including one user symbol) is also given in dotted lines. For simplicity, the slanted edges of the various regions have been given as straight lines. In practice such edges follow the discrete positions of the symbols, and the region has stepped edges (cf. FIG. 17).

FIG. 4 by way of comparison gives a product code format. Product codes per se are considered common general knowledge. In the example, block D of data symbols has a dimension of 6 rows and 7 columns. To obtain the check symbols in block P, for each of the six rows the code word is calculated. Next, to obtain the check symbols in blocks Q, QP for each of the eleven columns, i.e. seven columns of data symbols and four columns P of check symbols, the code word is calculated. Because of the properties of the product code, the block QP contains the row check symbols for which the column check symbols in block Q operate as data symbols. Thus, the additional two row code words need not be calculated.

The generating of the check symbols according to the present invention positions the symbols of a particular code word in a convolution-like manner, although the production rules of the constituent codes are pure block codes. Nevertheless, and in clear distinction from the Compact Disc organization, the present code, as explained with reference to FIG. 2, has a property that corresponds to one of a product code; the second check symbols bring about error protection for the data symbols, for the first check symbols, and for the second check symbols themselves, and the first check symbols also bring about error protection for the data symbols, for the first check symbols themselves, and for the second check symbols. The reason is that the first check symbols are calculator through the retrocoupling described with reference to FIG. 1. An extra advantage of the type of encoding of the present code versus product codes is that about 50% less storage space is required for the processing as compared to product codes. Additional advantages with respect to the CD format are reduced decoding latency and simplified block synchronization.

Figure 5:
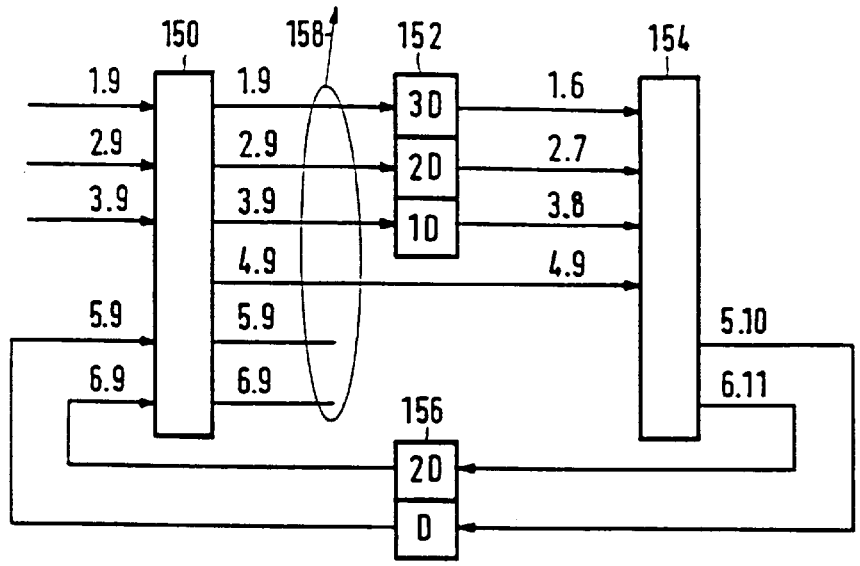
FIG. 5 offers a detailed explanation of an encoding embodiment.
Figure 6:
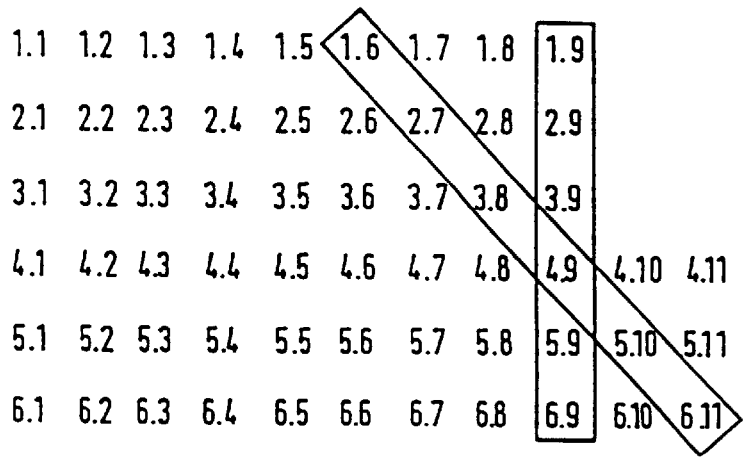
FIG. 6 shows positions of the various code symbols.

FIG. 5 gives an exemplary block diagram of an elementary encoding device wherein the sizes of the code-words have been substantially restricted in order to show the various delays as clearly as possible. In this respect, FIG. 6 gives positions of the various code symbols. There are three streams of information symbols, starting with 1.1, 2.1, 3.1, respectively. There is one stream of first check symbols, starting with 4.1. There are two streams of second check symbols, starting with 5.1, 6.1, respectively. On the carrier the symbols of any particular column may be stored contiguously, column by column. The first check symbols are formed on the basis of a single column as indicated by a first rectangle in FIG. 6. The second check symbols are formed on the basis of a diagonal string of symbols as indicated by a second rectangle in FIG. 6. If required, the second code words may have a greater depth of interleaving, for example in that any particular word of the second code has symbols in every second, third, etc. column. In FIG. 5, the data symbols 1.9, 2.9 and 3.9 arrive from the left in a first arranging state at the input of the first encoder for producing the first check symbol 4.9. In practice, a plurality of first check symbols is produced, because a single check symbol does not render a symbol error correctable; indeed, it is desirable that each code word on its own in principle renders at least one symbol error correctable. For simplicity, the delay incurred by the generation process in block 150 is ignored. In delay block 152 the realignment for producing a second arranging state is effected. The delays differ by one column period, and decrease from three periods to normally zero. At the input of second encoder 154 the indications are shown of the symbols arriving at that particular instant, thereby realizing the second arranging state. From the four symbols thus received the second encoder produces the two second check symbols 5.10 and 6.11. In delay block 156 the second check words are delayed so as to be in concord with the first arranging state at the input of the first encoder 150. The delays again differ by one column period, and the indications of the second check symbols arriving at the input of the first encoder 150 are 5.9 and 6.9, respectively, and belong to the same column as the data symbols arriving there. This means that the first encoder produces the correct column that may be transferred to the storage medium or carrier as indicated by the arrow 158. It should be clear that the position of the two encoder blocks can be interchanged, causing the unencoded data to arrive first on the input of second encoder 154. However, this often would cost more delay. In the above situation, also shown in FIG. 2, adjacent symbols of the first arranging state are delayed by respective delay times to put them into respective adjacent words of the second code or into adjacent instances of the second arranging state. If all delays shown are multiplied by a uniform factor, the set-up would allow deeper interleaving for in order to enhance protection against error bursts, be it at the expense of higher storage requirements. Persons skilled in the art would discern in FIG. 5 possible amendments that would not be at variance with the inventive principle. For example, the time could run in the opposite direction in the Figure, so that inputs and outputs are interchanged. Furthermore, the delays could be implemented in RAM. In that case, the delays as well as the feedback are realized by appropriate addressing of the RAM. The matrix multiplications necessary for encoding can be effected by means of suitably programmed standard hardware, or by special purpose hardware. If the two codes have sufficient likeness, parts of the encoders could be used in common.

In order to improve the robustness of the encoding against error bursts, odd-even interleaving can be applied as discussed in, see the above prior art references. This means that odd-channels are delayed by a uniform amount with respect to the even channels, or vice versa. The odd-even interleaving is applied to the information transferred to the carrier as indicated by reference numeral 158. Odd-even interleaving then is to be applied to the decoder as well, inverse to that applied to the signals supplied to the carrier 158. Block 159 in FIG. 7 can be modified to take this interleaving into account. A further improvement can be provided by scrambling at the output; this is effected by adding a systematic bit pattern to the stream of encoded symbols. This solves problems caused by a malfunctioning apparatus generating zero bits only.

Figure 7:
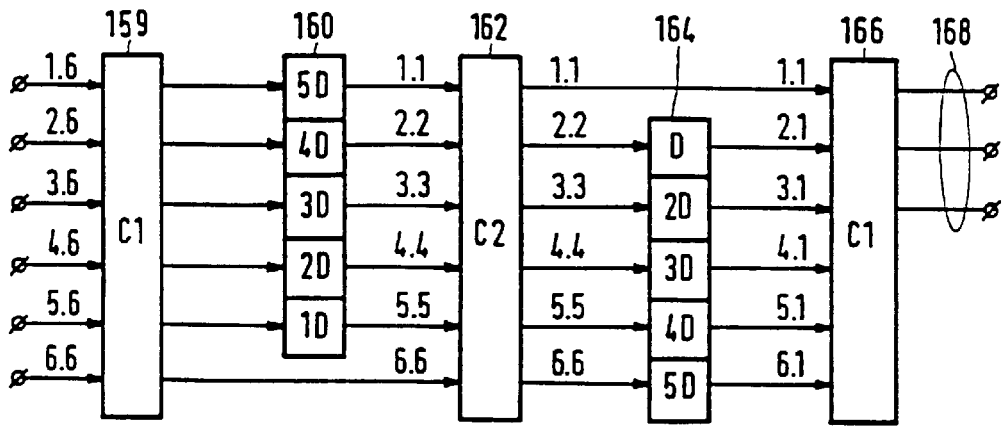
FIG. 7 offers a detailed explanation of a decoding embodiment.

FIG. 7 gives a detailed explanation of the decoding to conform with the set-up of FIGS. 5, 6. At the left-hand side the symbols of a complete first code word arrive from the carrier, where the symbols of a particular first code word are positioned contiguously, as abstracted from the above odd-even interleaving, or otherwise, such as from a broadcast reception. Block 159 is the first decoder for the first code words. The decoding is supposed to be instantaneous, so that the symbol numbering is not influenced by the decoding. Any actual delay, however, would not alter the reasoning. Next, the symbols are delayed with monotonously decreasing delays (D) in block 160, causing the respective symbols of one second code word to be realigned at the input of second decoder 162. The decoding is again supposed to be instantaneous. If the decoding has satisfactory results, the output of the second decoder 162 may be forwarded to a user directly via a second delay stage 164 which has the inverse delays values as compared to block 160. If not, the output of second decoder 162 is forwarded to user via second delay stage 164 and a third decoder stage 166. In this latter option, the first code word is presented to third decoder stage 166 that in fact may share hardware with the block 159. If the C1 and C2 codes are sufficiently alike, also block 162 could join in the sharing. At the output 168 the user symbols are presented. In case the third decoding operation is foregone, it may nevertheless be advantageous to keep the second delay stage 164, be it only for the user symbols. If necessary, the second code words may be reconstituted and decoded again by repeating the block 162, 160.

Figure 8:
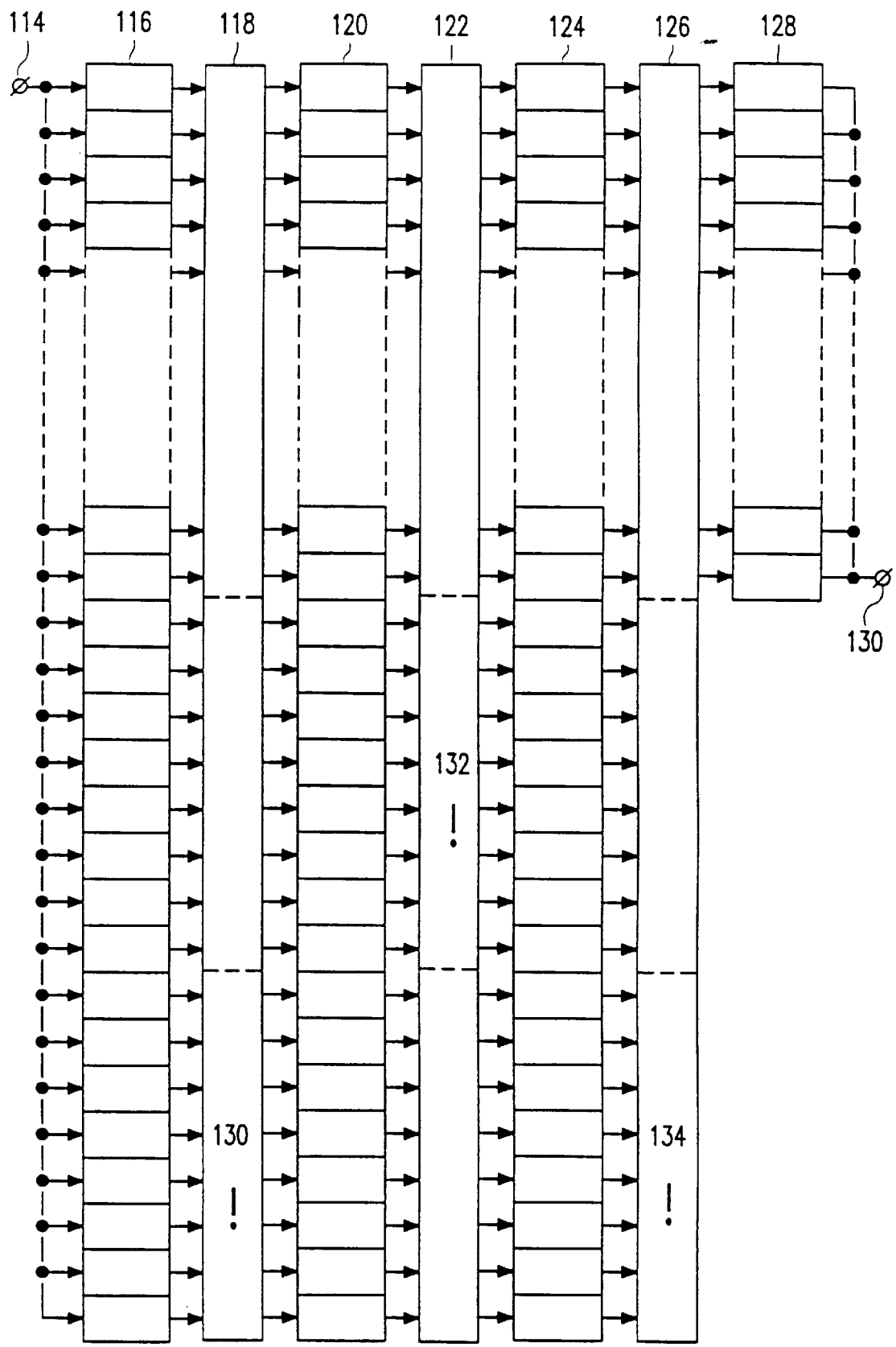
FIG. 8 shows an overall block diagram of a decoding device.

FIG. 8 shows a block diagram of a decoding device of more realistic dimensions. The stream of encoded symbols arrives at input 114 that again may be 8 bits wide for eight-bit symbols. Block 116 is the input storage that takes up the symbols according to order of arrival and according to a selection mechanism that assigns the symbols to their original channels. The delay allows the various symbols to be presented to the first decoder stage 118 at the correct instants. Decoder 118 needs to receive the incoming symbols at the same data rate as the input 114; for each code symbol received it first determines the contribution thereby to the various preliminary syndrome symbols of the word of the first code to which the symbol in question belongs, as symbolized by the exclamation mark in block 130. After generating the syndrome symbols, the decoder executes the decoding proper which may have various ones of the standard outcomes: find that the code word is correct and thus forego any correction (a), find certain errors correctable and correct them according to findings (b), or detect that the word is uncorrectable at least as far as the correction strategy goes (c). Case (a) may assign to all symbols of the correct word an O.K. flag. Case (b) may selectively assign to the correct symbols of the code word in question a correction flag and for the remainder again the O.K. flag. Case (c) may assign to all symbols of the code word in question an unreliability flag, which flag may further specify various unreliability levels. The use of flags per se as produced by an earlier processing stage such as the demodulation has been taught by both references I, II.

Next, all channels enter the second level of decoding. Block 120 is the intermediate storage to align the codes symbols, inclusive of second and first check symbols, for processing by the second decoder stage 122. Block 122, in a similar way as the block 118, calculates the syndrome symbols associated with the second code words and executes the decoding and in principle has the same three possible outcomes as the decoder 118. However, the strategy may be different: firstly because many errors will have been corrected already by the earlier stage 118, and secondly because additionally help is provided by the unreliability flags provided by the first decoding stage that may be used as erasure pointers, and by the O.K. flags that may advise on the maximum numbers of error symbols and erasure symbols, respectively, to be decoded. In consequence, after the second stage the number of residual errors generally has diminished. The decoding of the second code words has been indicated by the exclamation mark in block 132.

Next, all channels enter the third level of decoding. Block 124 in the intermediate storage to align the code symbols, inclusive of second and first check symbols, for processing by the third decoder stage 126. Block 126, in a similar way as the block 118, calculates the syndrome symbols associated with the first code words and executes the decoding and in principle has again the same three possible outcomes as the decoder 118. However, the strategy may again be different as explained with respect to the decoder stage 122. Furthermore, due to the intermediate passage through the second decoder stage, the number of residual errors subsequent the third stage generally is still less than subsequent to the second decoder stage. The decoding of the first code words has now been indicated by the exclamation mark in block 134. It should be noted that in the cross-interleaved Reed-Solomon code organization of the Compact Disc system, at most two levels of decoding were useful, because each single decoding operation fully exploited the possibilities of that level, be it regarding the first code or regarding the second code. At least, the hardware of the third level decoder can to a fair extent be shared with the hardware of the first stage, in case the codes are identical, although the strategies applied generally are not. The hardware pertaining to the C1 and C2 codes, respectively, may also be shared if the codes have corresponding character, in particular if one code is a sub-code of the other. Another difference with respect to the Compact Disc system consists in that the latter has decoding in opposite sequence with respect to encoding. According to the present invention, the sequence of decodings is in principle arbitrary.

Block 128 is the output storage that takes up the data symbols for sequentially correct presentation to serial output 130. Generally speaking, the check symbols will not be considered further thereafter.

Figure 9:
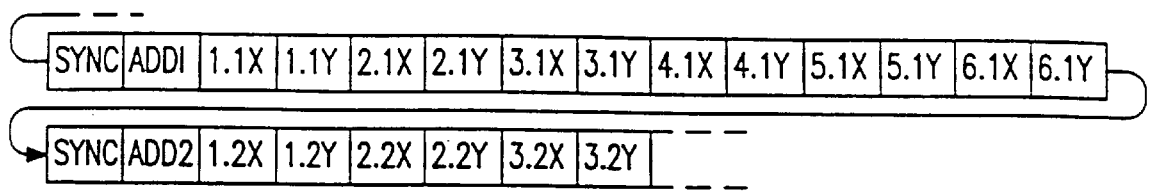
FIG. 9 shows a symbol disposition on a carrier.

FIG. 9 shows a physical symbol disposition on a carrier. These data form a source for the decoding. The format has a synchronization header labeled SYNC, and an auxiliary header part labeled ADD. The latter can be used for storing information that does not directly belong to the main body of information, such as an address. The format can be defined in such a way that only a predetermined fraction of the format as shown effectively gets the parts SYNC and/or ADD. Now, in the example, each format has alternating symbols labeled X and Y, respectively, to effect an odd-even interleave among the symbols. This is a countermeasure against short error bursts. Within the sequence of symbols, such as 1.1X . . . 6.1X, the symbols are stored monotonously with respect to their occurrence in the first arranging state as shown by their numbers, inclusive of the associated first and second check symbols. In practice, the number of symbols of the various code words is much higher than six. Note that the notation is different from the one in FIG. 6 that shows the various channels which here are serialized. For simplicity, extra effects through scrambling have been ignored.

2. Note that the use of this type of encoding allows for an all-zero code word. If no further measures were taken, a hardware error giving rise to the occurrence of an all-zero word could not be distinguished from a valid all-zero code word. Thus, an overall or selective inversion of the parties can advantageously be applied directly prior to the re-writing on the carrier; see the prior an reference mentioned above. Usually the inversion is uniform for all words, for example, all first check symbols are inverted, but not other second check symbols. Other choices are also feasible.

3. In several applications, the user data are supplied in segments, for example of 16 kbytes each. The data of a respective segment are written into respective storage blocks, together with the parity or check symbols associated with those data. A change in the data of a specific storage block and an update of the parity symbols should preferably be accomplished without affecting the data or parity symbols in other storage blocks. When applied to such block-oriented applications, the encoding method discussed above may benefit from a modification in order to improve its efficiency. The modification of data of a single C1-word (of s data symbols) influences not only the C1 check symbols of this particular word, but also the next-following s+q−1 C1-words, see FIG. 3. Hence, for encoding a segment with ms (m times s) data symbols, the total number of C1-words required equals m+s+q−1.

Figure 12:
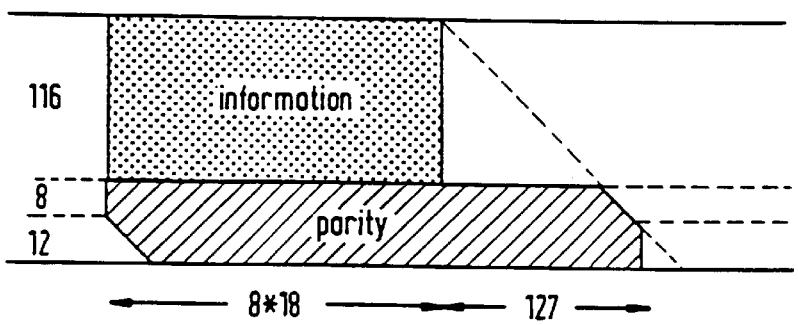
FIG. 12 shows a convolutionally encoded data block.
Figure 13:
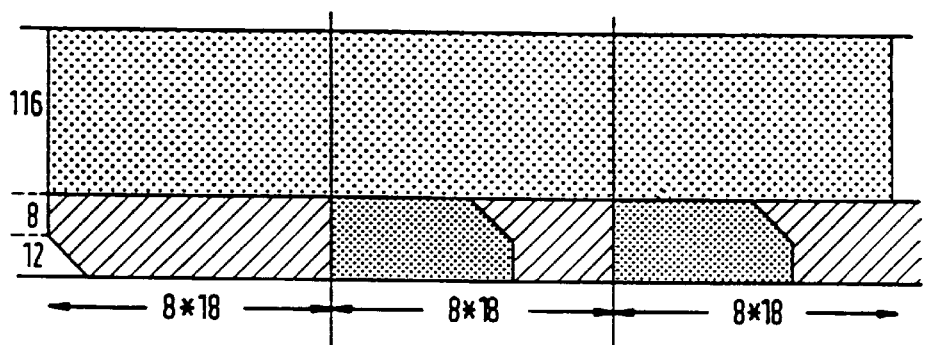
FIG. 13 shows encoding of repeated data blocks.

In this respect, FIG. 12 shows a convolutionally encoded data block, in so-called cylinder format, wherein, by way of example, s=116, p=8, and q=12. The total number of columns containing check words relating to this datablock is m+127. As an extension. FIG. 13 shows encoding of repeated data blocks, each of which separately has the dimensions of the single block of FIG. 12. Now, the check symbols of the successive blocks will overlap as denoted by respective darker areas. This means that the relative overhead in terms of extra columns decreases as the amount of user data grows. On the other hand, such overlap is often considered an encumbrance.

Efficient handling of block oriented applications is discussed below. The inventors have found that if m≧n=s+p+q, a segment of ms data symbols can be encoded in a number of m C1-words in a manner as described above with single fold-back, retaining the same error correcting capabilities. The s+q−1 additional C1-words as required in FIG. 12 are absent then. Hence, the number of data that can be written on the carrier can be increased by a factor of 1+(s+q−1)/m. For example, if m equals n, which is among preferred storage formats, and s+q is large with respect to p, nearly twice as many data can be stored.

Figure 10:
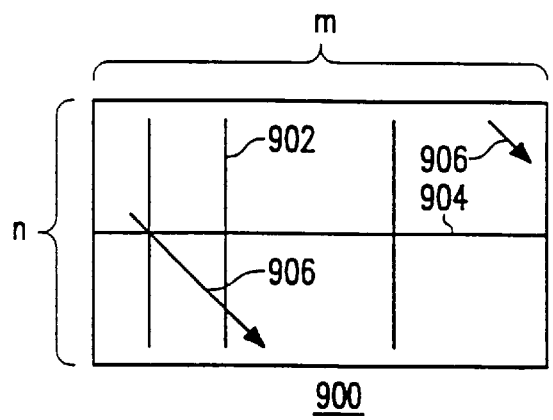
FIGS. 10 and 11 show matrices for explanation of a block code.

The above approach is based on the following insight. A code word of the new block code is an m×n matrix 900 as shown in FIG. 10. The matrix 900 has columns, for example column 902, rows, for example row 904, and cyclic diagonals, for example cyclic diagonal 906. Within this context, a cyclic diagonal is an arrangement of respective matrix elements that are in respective ones of successive columns and in respective ones of successive rows, the rows being cyclically continued. For example, as shown in the drawing, whenever a cyclic diagonal with an orientation from left to right and from top to bottom reaches the right-hand edge of the matrix, it is cyclically continued at the left-hand side. The matrix 900 contains a number of m cyclic diagonals of this orientation. Each of the matrix columns is in C1 and each cyclic diagonal is in C2.

Figure 11:
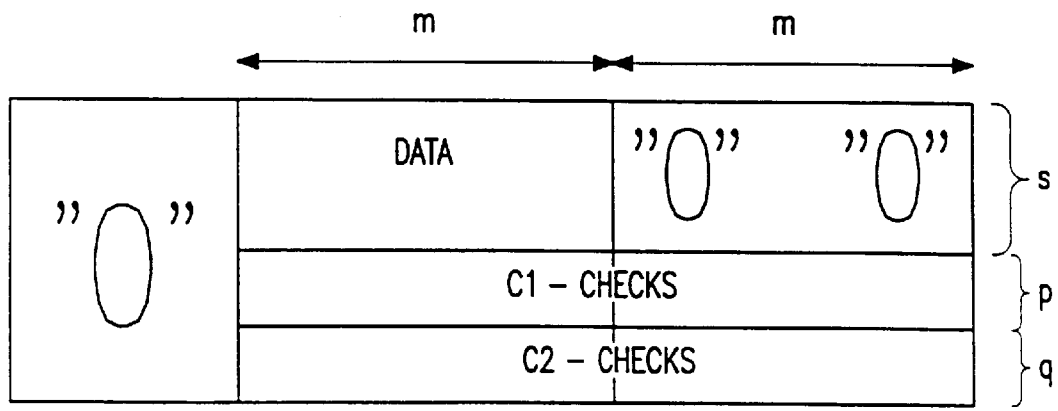

Decoding of a block code word can be achieved by combining decoders C1 and C2 as described above. Encoding of such relatively broad cylinders is explained with reference to FIG. 11, showing an (n−1+2m)×n matrix 1000. The first n−1 columns at the left contain zeroes and are referred to hereinafter as the all-zero columns. The next m columns are called data columns. Each data column comprises s data symbols in the s top rows and p+q parity symbols in the p+q bottom rows. The last m columns are called the lead-out columns. Each of the lead-out columns only zeroes in its s top rows. Note that owing to the properties of encoding above the last m−(s+q−1) lead-out columns contain zeroes only.

Figure 14:
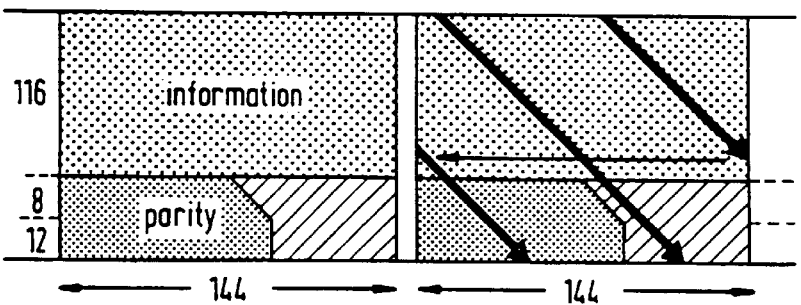
FIG. 14 shows cylindrically encoded data blocks.

The parity symbols in the data columns and in the lead-out columns are computed according to the manner explained above in order to make all these columns C1-words and to make all diagonals with at least one element in the data columns C2-words. The i-th column of the block code word equals the sum of the i-th data column and the i-th lead-out column. Now, as all data columns and lead-out columns are in C1, all columns of the block code word are in C1. It can be demonstrated that all cyclic diagonals are in C2. Effectively, the parity symbols in the lead-out columns are combined with those of the data column through a logic operation, for example EXOR. In this respect, FIG. 14 shows cylindrically encoded data blocks, extending the performance of the arrangement according to FIG. 12. As is shown, part of the redundancy information is identical to that produced in FIG. 12, but another part is produced by superposing the "tail" at the right in FIG. 12 over the region directly below the user symbols. At the right hand side it is shown that there are two types of C2 code words (denoted by arrows): one that runs in a straight manner from top left to bottom right, and one that is wrapped around, so that it starts again at the left-hand side after having reached the right-hand side.

The device disclosed, for example with reference to FIG. 5, can be used for encoding in the following manner. In order to simulate the (n−1) all-zero columns, the contents of the delay means, for example the block 152, are set to zero. Next, the ms data symbols are applied to the encoding device. The C1 and C2 parities for the data columns are computed and stored. Subsequently, (s+q−1)s zero symbols are applied to the encoder device and each computed parity symbol is added to the parity symbol generated a time period of m C1 words before. The addition can be accomplished either on a C1-word-to-C1-word basis or using partial or full parallelism. A further extension of the above will be discussed hereinafter.

Figure 15:
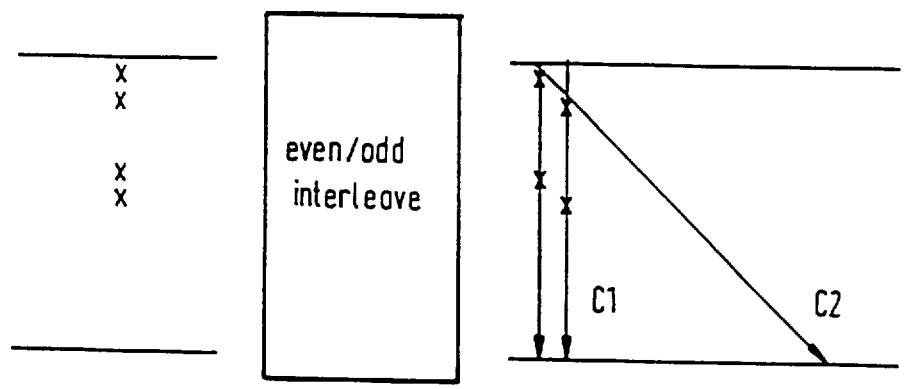
FIG. 15 shows alignment of short bursts with odd-even interleave.
Figure 16:
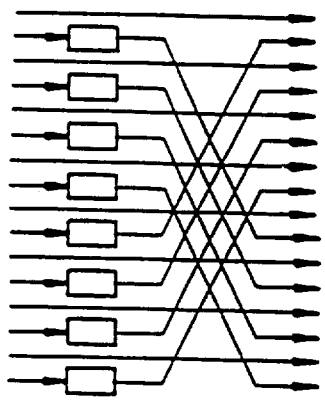
FIG. 16 shows odd/even interleave with symbol permutation.

4. Referring once more to FIG. 5, after encoding the output usually is taken at indication 158. There is a requirement that the C1 word columns should cover only a very short stretch on the data carrier. Now, among the most frequent errors are short bursts, rather than random single bit errors. Reasons are local defects of the storage carrier caused by the technology, and also propagation errors that may arise from the operation of the demodulation that is situated between the channel or medium and the error protection decoder. This problem, while adhering to the 'short stretch requirement' supra, is treated by a so-called small interleave mechanism that has even channels delayed by one C1 word interval as compared to odd channels, or the other way round. However, in combination with the C2 interleaving shown in FIG. 6, this may cause mapping of such two successive symbol errors on a single C2 word, so that the problem remains: this aligning of short bursts with odd-even interleave is shown in FIG. 15. The solution is shown in FIG. 16, involving a collective and uniform transposition of low-numbered channels after the interleaving delay shown by a block, to high-numbered channels, and inversely for the low numbered channels. This permutation can be effected in various other ways, such as by permutation within a fraction of the s sequences. At the decoder of course, the inverse measure is undertaken.

5. Under item #3 supra, the so-called cylinder-storage for limited length blocks within a short-length stretch of the medium has been considered. The odd-even permutation under #4 should then be performed on a block basis. Conceptually, the cylinder after the C1/C2 encodings consists of n rings being the codeword length (i.e. the total number of rows). Then, the even rings should be uniformly rotated over one position relative to the odd rings. Furthermore, in each respective column the delayed symbols, or alternatively the undelayed symbols, should then be permitted as described above.

From the point of view of limiting error propagation, the odd/even deinterleave should not be undone before delivery at the user location. In fact, confinement of errors is only possible if erroneous bytes are known and optimally such bytes should be detected by decoding the C1 code that would be the best indicator. Therefore, odd/even interleave in the encoder should only be present as a postprocessing stage after the other encoding and before the data are written on a carrier. Likewise, in the decoder the odd/even deinterleave should only be present as a preprocessing stage before the data enters the C1 decoder for the first time.

6. Upon decoding, the output can be fixed at the output of block 166, that is after the second C1 decoding as shown in FIG. 7. Another solution in the following: if the first C1 decoding in the block 159 is sufficiently successful, the output of the block 159 is directly connected to the user. If the first decoding is not sufficiently successful, the output of the block 166 is connected to the user. Through the usage of both interleaving blocks 160, 164, the presentation to the user in always in the correct sequence of symbols. Supplying the user information at an earlier stage of decoding will speed up the access. Outputting may alternatively be after block 164.

Figure 17:
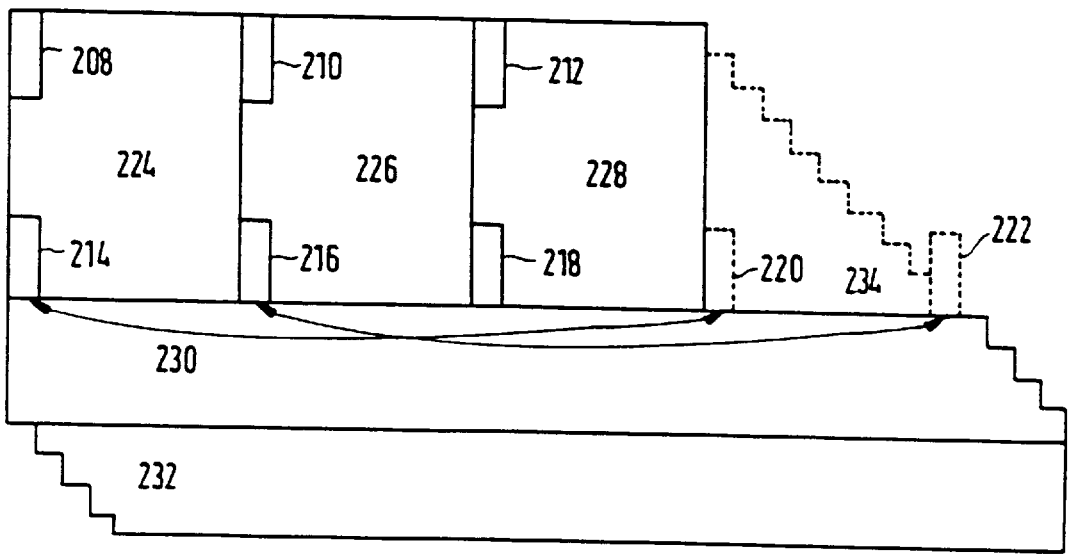
FIG. 17 shows an improved storage organization that features unequal error protection.

7. FIG. 17 shows an improved storage organization that features unequal error protection. The idea is based on the fact that a sector may contain 2048 user bytes plus particular header information of a few bytes. This header information often contains an address, counter data or other information that is used for selectively accessing one or more particular sectors. In consequence, it is advantageous that such header should be well-protected, as well as quickly accessible. The following solution is advantageous: the header in each sector constitutes part of the first C1 word and as such is protected by both the C1 correctability and by the C2 correctability. Furthermore, it has been found that the sector format still has a few spare bytes. These now are put into the first C1 word of the sector and filled with additional C1 check words, thereby improving the error protection for the header. Preferably, the enhanced code C1' is a subcode of the original code C1; this allows double use of hardware and/or software facilities. If the information is protected by Reed-Solomon codes, this increases the minimum Hamming distance alone for this first C1 code word of the sector: for n–k check symbols, this distance is n–k+1. In that case, preferably all symbols that are uniform zeroes is all C1 words are also zeroes in a C1' word. If a header would not fit in a single C1' word, it should be positioned into a series of contiguous C1' words. In order to have a finite impulse response to the header-containing words, the following condition must be satisfied. If C1' has T more check symbols than C1, there should be at least a number of (T+q–1) C1 words between the C1' word encoding header information from a sector and the first C1' word encoding header information from the next sector. For finding a particular intended header, in first instance only the C1' code words containing the headers are decoder. Only if the correct decoding of a C1' code word in question proves to be impossible, it would be necessary to go for the complete decoding of the associated C1 words and C2 words. Because usually only the first C1' word needs to be decoded, access to the header is extremely fast. However, even in case the C1' word decoding fails, still the full decoding is still not always necessary. For example, the sectors can be numbered in a monotonous but unevenly spaced sequence. If the predecessor sector has a lower number than sought and the sector in question has an uncorrectable C1' header word, first the next sector is tried. It is only if the latter has a higher number than sought that the full decoding of the intermediate sector is undertaken. If this UEP (Unequal Error Protection) feature is used in combination with the cylindrical storage as taught under #3, the extra-protected C1 words have their redundancy mapped on top of other extra protected C1 words in order to keep the limited extension of their parities intact.

As is shown in FIG. 17, there are three sectors of information 224, 226, 228, each with its respective header 208, 210, 212. The C1' words containing the header have their respective extra C1' code check symbols 214, 216, 218. The C1 check symbols are present in strip 230 and the C2 check symbols in strip 232. There are two notional sets of 'extra' C1' check symbols 220, 222, and a notional amount of information symbols 234. In the case of cylindrical storing, the column of item 220 is overlaid on the column of item 214, and the column of item 222 is overlaid on the column of item 216. Overlaying is done by adding of symbols in the Galois field in question; this usually comes down to bit-wise modulo-2 addition. The further columns are overlaid in like manner.

8. In certain situations the cylindrical storage according to FIG. 10, 11, 14 has too high a storage capacity; for example, if m is much smaller than s. In that case, of which FIG. 3 represents an extreme version, the cylinder is made tighter than according to FIG. 14. However, this means that the total number of check symbols becomes lower than shown in FIG. 3. Although this configuration is still relevant under the overall coding format, the degree of error protection in terms of the number of correctible errors may decrease. However, the rate and overhead quantities remain the same as for a very long block of information such as shown in FIG. 13.

Figure 18:
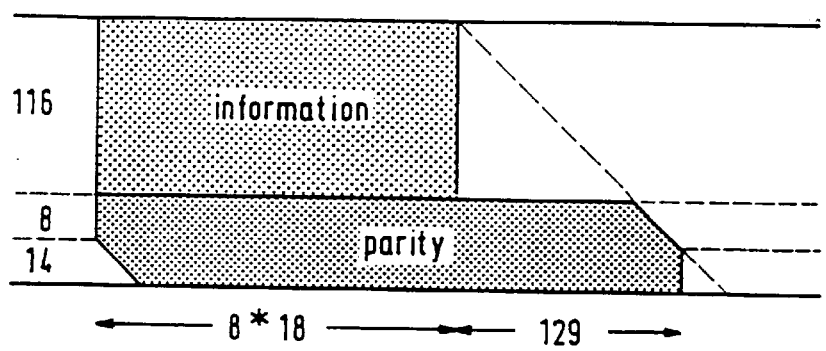
FIG. 18 shows a finite support convolutional diamond code word.

9. The following is an alternative to the above encoding of cylinders. First, FIG. 18 shows a finite support or size convolutional diamond code word; it generally corresponds to FIG. 12, but has two additional check symbols per C2 codeword. Now, according to an advantageous block definition, the smallest addressable storage block contains 8 sectors of 2088 data bytes each. Each sector is stored in 18 columns, because each column has 116 data bytes. The necessary on-disc space now amounts to 129 additional columns, so that at this level the efficiency is only about 44%. For a single sector, the storage efficiency is even much lower, i.e. of the order of 10%. These figures are generally considered much too low.

Figure 19:
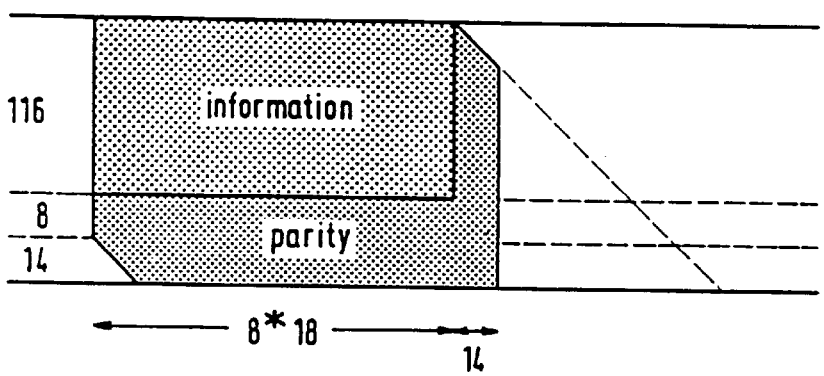
FIG. 19 shows a block convolutional diamond code word.

A feasible solution to this problem is to calculate redundant columns of symbols in such a way that their contribution according to the code rules of the same semi-cyclic and diamond codes as used throughout the present invention exactly compensates the tail shown at the right in FIG. 18. Another way of phrasing this would be to say that the response to these redundant columns exactly cancels the redundant rows extending to the right from the redundant columns. In this respect, FIG. 19 shows a block-convolutional diamond code word that adds 14 columns of redundant symbols, which number is exactly equal to the number of C2 check symbols per codeword. Even for a block having only a single sector of user words the efficiency is thus raised to about 47%. The number of extra parity columns is independent of the width of the information block. The sequence of check symbols so generated satisfies the encoding rules: each column is a code word of the C1 code and each diagonal is a code of the C2 code. The latter code word includes the zero symbols at the right outside the block indicated in FIG. 19. If applicable, also the zero symbols at the left outside the block of FIG. 19 are included. The codes used are linear codes, which means that the sum of two code words is again a code word.

Figure 20:
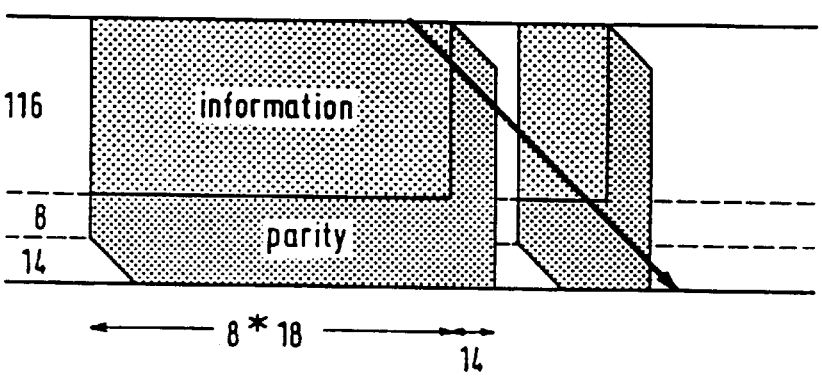
FIG. 20 shows concatenated code blocks according to FIG. 19.

In this respect FIG. 20 shows a concatenation of code blocks according to FIG. 19. This type of formatting is very advantageous for a storage organization where writing of fresh data on the medium is allowed next to the reading. Due to the finite amount of information that is generally produced at a particular time, the storage thereof should occupy a part without the tail shown in FIG. 18: this would allow closely spaced storage of successive blocks. Note that according to FIG. 9 successive code words are also stored one directly after the other. An extra requirement for the storage organization would be that decoding should be feasible with the same hardware.

The heavy arrow shown runs along a particular diagonal, i.e. in the direction of the C2 code words. Each of the two "blocks" crossed by this arrow contributes a separate valid code word, regardless of the distance between two blocks, even if this distance is zero. It is not necessary that the blocks are of equal size. This means that once the start of a particular block in a sequence of blocks is known, that block may be decoded, without keeping track of any other block, by stuffing any other symbol on a C2 diagonal with zeroes outside the inner contents of the block(s) in question. This comes down to simulating an artificial, error-free information environment. The storage format as described has two purposes. First, for a writable medium, the long tail at the right in FIG. 18 need no longer be present, thus raising the efficiency of the storage. This would also be advantageous in a read only organization, because the decoder can start to operate directly when the commencement of the encoded group sectors has been recognized: the preceding sectors need not be taken into account. Therefore, the latter of the access is diminished at the expense of a somewhat lower storage efficiency due to the added columns of redundancy symbols.

Furthermore, some kind of linking information or synchronizing information is required that allows the decoder clock to be resynchronized to the medium synchronization, particularly at the start of each block. As seen from the decoder, such linking information is preferably replaced by columns of only zeroes or is completely skipped inasmuch as its contents are inconsequential. The length of such synchronizing information is arbitrary, provided it corresponds to a multiple of columns. If a player or decoder can recognize such synchronizing information, all arbitrary data formats can be intermixed and at the same time read by the standard Diamond decoder without compromising on corrective power. If a synchronizing information cannot be recognized by the decoder, the associated column is erased, which causes a slightly lower corrective power. Provided that the synchronization mechanism does not become desynchronized, a mixed sequence of contiguous blocks according to the above can then still be read correctly. In practice, the size of such synchronizing information corresponds to about three columns.

Figure 21:
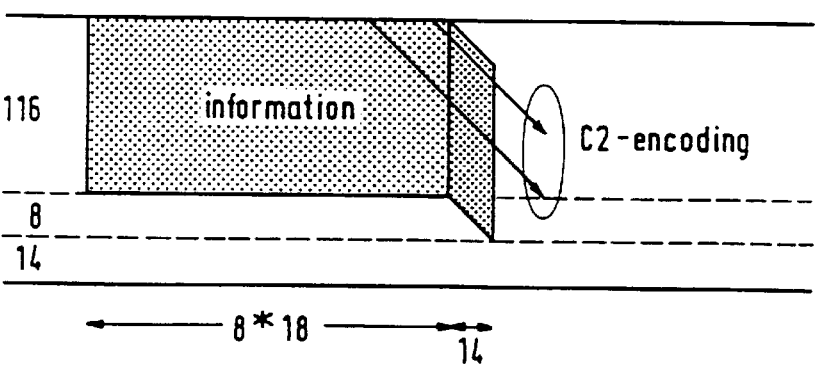
FIG. 21 shows preparation of blocks for encoding.

FIG. 21 shows the preparation of a block for encoding. Encoding is effected as a sequence of two successive steps. The first step consists of the preparation of the information symbols of the parity-only columns (here fourteen) at the right such that the encoder arrives at the all-zero state at the end of the encoding of the last parity column. As is shown in FIG. 21, this can be done by using the standard C2-code encoder for this limited number of symbols. The information symbols present in the C2 code words to be formed in this way are treated as being the lowest-order information symbols contained in these code words, as indicated by the diagonal arrows. The check symbols so generated are put in positions that are data symbols of C2 code words. Next, the column-wise and further diagonal encodings are undertaken in the standard manner as explained earlier.

Hereinafter the encoding of short blocks is considered more in detail. The format is particularly relevant for recordable media. Read-only carriers and recordable carriers should as far as possible have mutually corresponding formats. With reference to FIGS. 19–21 the tail-up or Scorpion format has been discussed, which allows narrow spacing of contiguous blocks. For simplicity, the encoding in FIGS. 22, 23 considers a relatively small block of five rows (s=5) and eight columns of information symbols (m=8). Also the numbers of parity symbols are relatively low, to wit, three parity symbols for the column or C1 words (p=3), and two parity symbols for the diagonal or C2 words (q=2). There are four regions of parity symbols that way be formed more or less independently from each other:

a: starting from left, for each respective column, first a C1 code word is formed, and next a C2 code word is formed. In this case, for the encoding, the C1 parity symbols operate as data symbols for one or more subsequent C2 code words, and vice versa. The C2 parity symbols are situated in the lowest two rows and are shown hatched. The number y of these pairs, that each have one C1 code word and one C2 code word, may vary from zero to m: $0 \leq y \leq m$. In the Figure, y=4. The order of generating is mandatory, except for the last C2 code word that may be delayed, as will be discussed hereinafter.

b: for each data symbol of the rightmost column, except for the lowest data symbol thereof, the associated C2 code word is formed; these are shown hatched. The order of generating is arbitrary. The lowest data symbol will be considered under point #c.

c: starting from right, with respect to the lowest information symbol of the information column in question, a pair of code words is formed, that contains first a C2 code word, and next a C1 code word. The latter occupies the column wherein the final C1 parity symbol of the C1 code word just formed, is positioned. In this case, for the encoding, the C2 parity symbols operate as data symbols for one or more subsequent C1 code words, and vice versa. The C2 parity symbols are situated in the highest q=2 rows and are shown hatched. The number of these pairs, z, may vary from zero to m: $0 \leq z=m-y \leq m$. In the Figure, z=4. The order of generating is mandatory, except for the last C1 code word that may be delayed. All C2 code words of part b must be generated before the first C1 code word of part c. There is no interrelationship in the sequence of execution between parts a and c.

d: after generating all pairs of parts a and c, a diamond shape containing p×q parity symbols remains to be generated. According to FIG. 22, these are formed as q C1 code words; this necessitates the final C2 code word of part a. According the FIG. 23, these are formed as p C2 code words, which have been shown hatched; this necessitates the final C1 code word of part c. The order of generating for this part d. is arbitrary in both cases. It is feasible to produce the code words of part d as a mixture of C1 code words and C2 code words. Generally, the forming of the various code words should be done in a systematic way to optimize memory accessing and the like.

The type of encoding as described above can be done efficiently by means of shift registers as has been extensively described in EP-A-584,564 and corresponding U.S. application Ser. No. 08/107,547 herein incorporated by reference. In this reference, the parity symbols are located in a series of consecutive, although not necessarily final, positions of the code word. For the format discussed with reference to FIGS. 22, 23, the decoder must synchronize to the start of a new column of symbols. Synchronization on the sector level is not expressly needed, because any word that is present on a diagonal is a word of the C2 code. If a diagonal contains more than one word, these are concatenated words of the C2 code, which means that the decoder will always be operative. Of course, knowledge of the beginnings of the respective C2 words allows to separate them, which raises the correction capability of the decoder.

Next, the encoding of the so-called cylinder format of FIG. 14 is discussed. Also here, each block is read and written independently from any adjacent block. The decoder must synchronize to the block boundaries. Decoding of the individual words is similar to the tail-up or Scorpion format. The deinterleave procedure is naturally somewhat different.

Figure 22:
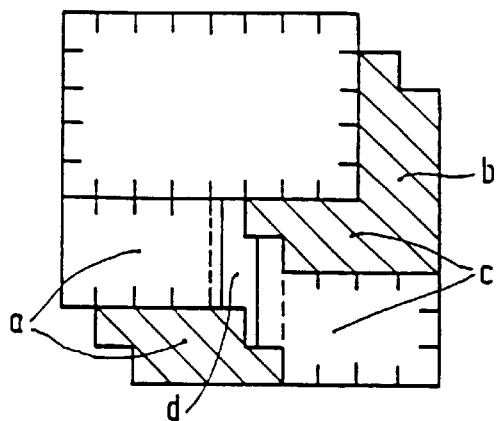
FIG. 22 illustrates encoding of a short block in a first manner.
Figure 23:
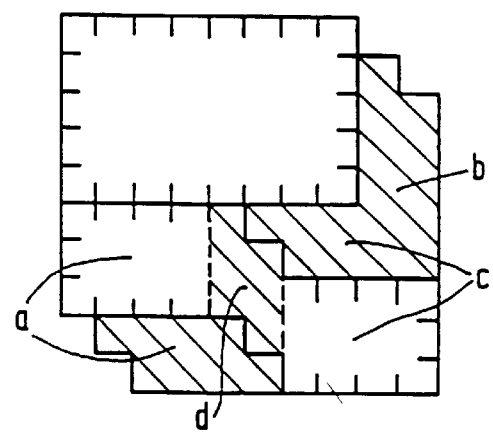
FIG. 23 illustrates encoding of a short block in a second manner.

The encoding is first discussed with respect to a hypothetical sequence of steps to prove its correctness; the block size is larger than in FIGS. 22, 23. Now, if the number of data columns m is at least equal to s, first the above part b is encoded. Of the parity symbols so formed, the outlined uppermost s=116 rows are symbolwise subtracted from the first q=14 columns of the data area, as symbolized in FIG. 24. Of course, if operating in a field of characteristic 2, such as $GF(2^r)$, subtracting is identical to bitwise Ex-oring. Subsequently, the remaining C1 code words and C2 code words of parts a, c, d are calculated as has been discussed with reference to FIGS. 22, 23. Ultimately, this produces a code block shown in FIG. 25 and all code words therein fully adhering to the Diamond code rules, albeit with the data of the first 14 columns overlaid with parity symbols.

Now, any Diamond sector, independent of the sector size, may be shifted horizontally along the lines shown, while still remaining a code word. Moreover, through the linearity of the codes used, symbol-wise addition of two code words again produces a code word. Now, assume that we add the block shown in FIG. 25 to a copy of itself after horizontal shifting over m columns (the width of the information part). Periodical repetition thereof in the horizontal direction of the shifting and adding yields a periodic information structure with the intended cylinder format of FIG. 14, because on the data symbol rows the C2 parities would cancel each other through the finite field addition. Through this addition, all data reappear in clear. In practice, the same postprocessing is effected by adding all data and parities of the rightmost q=14 columns to the corresponding number of columns at the left side and leaving them out at the right side, as conceptually shown in FIG. 26 through the lined shape.

Figure 24:
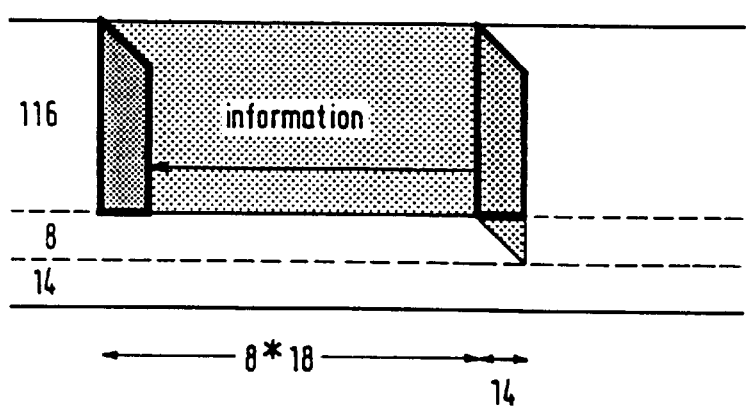
FIG. 24 illustrates adding of upright parities to information.
Figure 25:
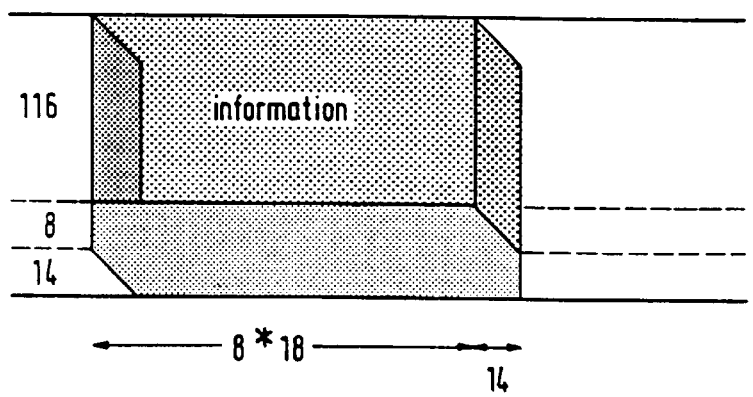
FIG. 25 illustrates diamond encoding.
Figure 26:
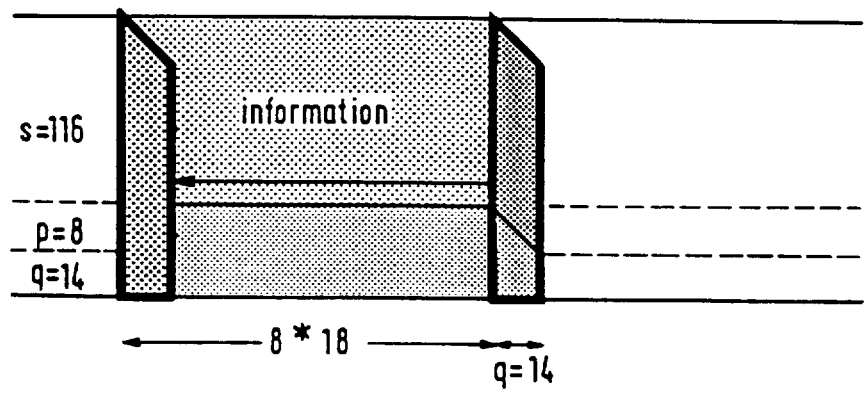
FIG. 26 illustrates diamond encoding and cyclic extension.

A practical computational sequence would be as follows: first calculate part b, then subtract as shown in FIG. 24, then calculate parts a, c, d as in FIG. 25, and finally add the last q parity columns to the first q columns as shown in FIG. 26. Alternatively, it may be advantageous to first calculate the parities in part b, and next calculating parts a, c, d, while taking into account the contribution thereto of the parity symbols of the rightmost q columns, and finally suppress those rightmost q columns.

Figure 27:
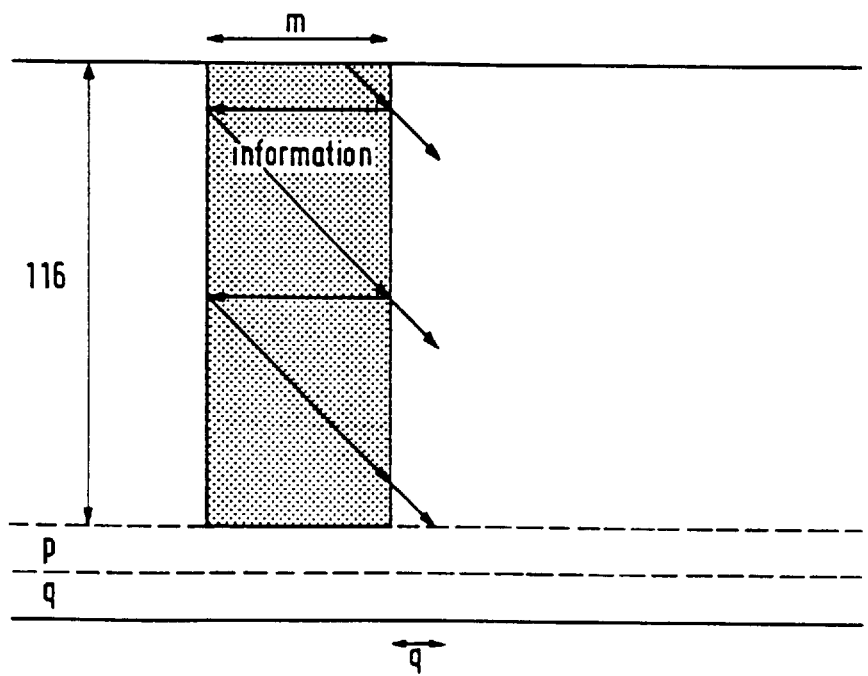
FIG. 27 illustrates efficient generation of the upright tail.

FIG. 27 shows efficiently generating of the parities of an upright tail, and of course, the lower p+q rows of parities, in case the width m of a data block is less than its height s=116 columns. The generation of the parities of the upright tail can be done efficiently with a feedback shift register encoder operating according to g2(x) that is the generator polynomial of code C2. The heavy arrows show one composite C2 code word for m about equal to 44. During the calculation all bytes of the folded C2 code word in question are fed to the shift register. When the right hand edge of the data block is reached, the shift register contains the q parity symbols pertaining to the C2 code word that should then be written at that part of part b: these parity symbols have been indicated by the arrows extending from the data block to the right in FIG. 27. After storing these bytes, and without changing the state of the shift register, the data bytes representing the next branch of the cyclically folded C2 word are presented to the encoder, as required. Only when starting a new code word at the upper edge of the information block, the shift register must be cleared. The total of such folded information words is equal to MIN(s,m). This method only generates the parities in part b. For the remainder, the calculation proceeds as shown with respect to FIGS. 24, 25 and 26.

Figure 28:
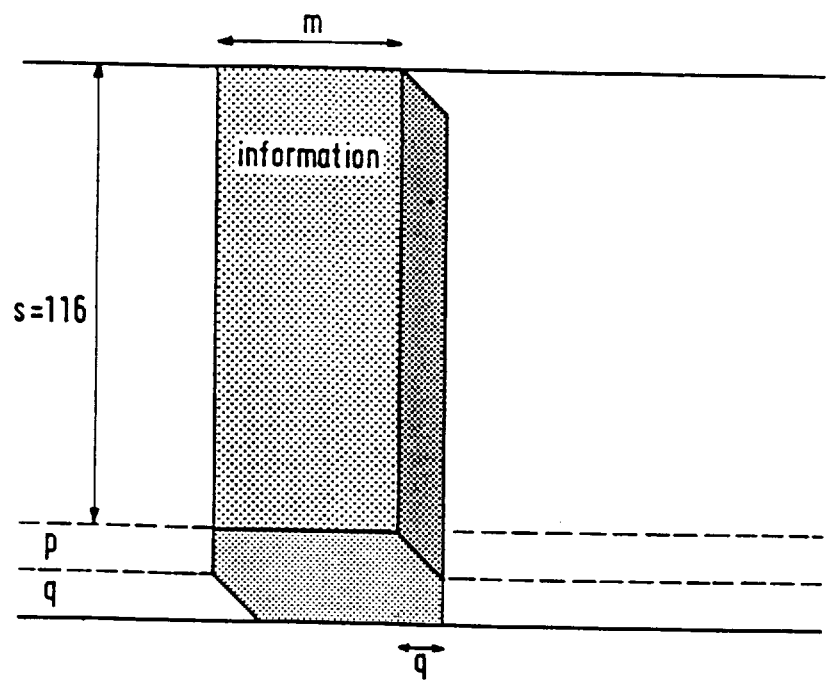
FIG. 28 illustrates modified scorpion preprocesing
Figure 29:
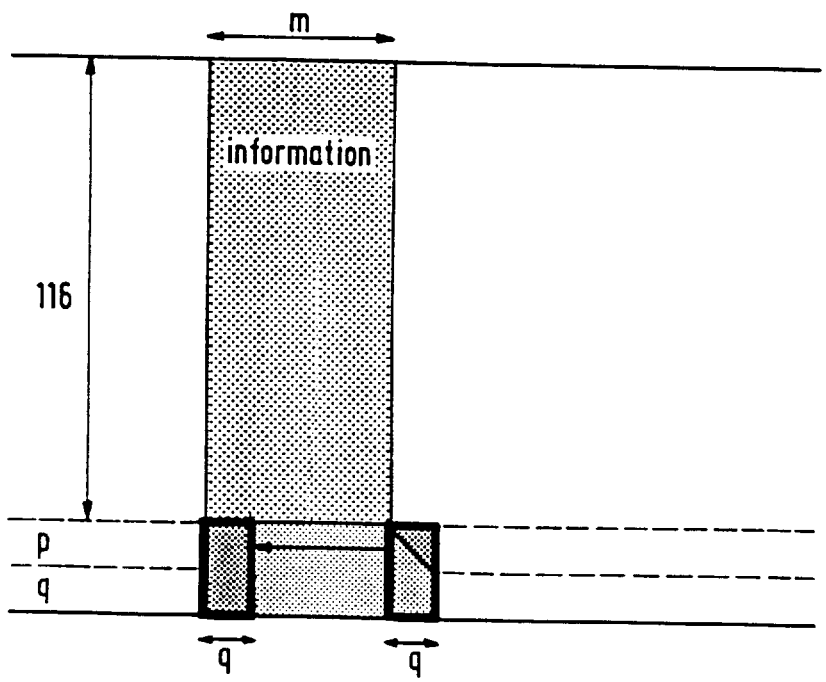
FIG. 29 illustrates the folding parities.

FIG. 28 illustrates a modified processing method for the narrow (m<s) cylinder format. Herein, the lower p+q rows of parities are calculated on the basis of the data symbols. The latter symbols are modified however by subtracting from the first q columns thereof the correspondingly positioned C2 parities from the q column of part b as discussed with reference to FIG. 25. The so subtracted symbol is on the same row, but m positions to the right. For $q \leq m$ no more than one subtraction from each data symbol is necessary. For q>m the procedure is modified: from each data symbol of the first m columns is subtracted the parity symbol on the same row, but m positions to the right, and also the parity symbols 2m, 3m . . . positions to the right until attaining the column number m+q. This procedure leads to exactly the same parity symbols as in FIG. 25. It should be clear that the modifying of the data symbols is only effected for the calculating of the parities, in that the unmodified data symbols are saved, or being included in the encoded block. Finally, the bottom p+q=22 rows of the rightmost q=14 columns are subtracted from their counterparts in the first 14 columns, inclusive of the triangle at bottom left that up to now was empty, as shown in FIG. 29. The procedure followed here is that the subtracting and later re-adding of the q columns of check symbols at right are made implicit. Again, if m<q, the subtracted symbols are positioned m, 2m, 3m . . . positions to the rights, until attaining column m+q. It should be clear that the cylinder format for low values of m is relatively less protected. As an extreme example, for m=1, the number of parity symbols is only equal to p+q.

For the actual implementation, various possibilities exist. Usually, the data symbols will be stored in an appropriate RAM memory. The accessing of the necessary symbol locations is by loading the address generators with the correct addresses, and presenting the symbols themselves to Galois Field arithmetic. For a recorder or writing device, a Diamond decoder according to the foregoing is present that also may serve for generating the parity symbols in the writing mode. In particular, since the number of C1 words for the encoder is equal to that relevant for the decoder, an easy way of C1 word encoding may be by using the C1 word decoder, while treating all parity symbols as erasure symbols. More particularly, C1 parity symbols generally fill completely the rows in which they occur of the strip of symbols, where in particular in FIG. 23 part a has maximum size (and in consequence part c is national only).

For encoding narrow (m<s) data block the number of C2 words is larger, at a generally lower number of symbols, than the number of C2 words necessary for decoding, because various C2 words after encoding are aggregated; this has been shown by the folding in FIG. 27. Of course, their data contents for the separate and for the composite words are identical. This may mean that encoding by means of an erasure decoder may take too much time. In contrast thereto, for a shift register encoder the C2 parity symbols are available immediately after the last data byte has been entered into the shift register. For this kind of encoder, the variable positions of the parity symbols in the upper rows of the information strip do not cause problem. On the other hand, if narrow data blocks must be encoded extremely fast, it may be advantageous to have a separate feedback shift register type encoder especially for encoding C2 words.

A different approach for encoding narrow blocks is based on the recognizing that the usage of two semi-cyclic codes in the case of very narrow strips may be less than optimum. This is seen best for a strip that contains only a single C1 code word: in that case, the C1 code word and the C2 code word would no longer add their protection capabilities together, because they would share zeroes. It has been found that an improved degree of error protection can be attained by making p and q variable, while keeping their sum constant, such depending on the width of the block as measured in C1 code words. An extreme solution is to render the value q equal to zero, as soon as the block width is lower than a predetermined bound. This can be realized in the arrangement of FIG. 5 by mapping both encoding operations on only one of the two encoders 150, 154, while using a generator polynomial with an increased number of p+q unique zeroes, so that the extended C1 code can be a subcode of the basic C1 code. Note the earlier considering of the C1' code that was used for increased protection of the block header. The extended C1 code and the C1' can to a large degree be identical, although their check symbols are located on different sets of rows. On the other hand, the increased number of check symbols off the C1' code can come on top of the extra check symbols of the extended C1 code. A straight-forward strategy for decoding high-distance codes, in particular Reed-Solomon codes has been described in U.S. Pat. No. 4,642,808 (PHN 10.710) by one of the present inventors and assigned to the same assignee.

Detecting of the block size can be done on the basis of a size indicator included in the block header. The feature of narrow block is particularly useful with computer data and the like, as distinct from audio-video data. The latter are often of relatively huge size. For the decoding of the modified block, the decoder of FIG. 7 only needs to know how many zeroes a particular code has, which number can have various different values as explained. In a particular realization, it was found advantageous to make q=0 for a block of which the width is smaller than about 20% of the height, both measured in numbers of symbols. Both for encoding and for decoding, various parts of the hardware can be rendered shared for interspersed blocks with various different values of q. Of course, on a carrier, such as a disk, there are essentially no technical blockades to such interspersing, once encoder and/or decoder can cope therewith.

We claim:

1. A method for transmitting a digital information signal in the form of a plurality of s sequences of information symbols, each symbol having a uniform bit length and each sequence of symbols occurring in a respective input channel, check symbols being included in the transmitted digital information signal as a result of encoding to enable correction of erroneous symbols caused by transmitting, said method comprising the steps of:

(a) applying a first block of s symbols, one from each input channel of a plurality of input channels, in a first arranging state to a first error correcting encoder to generate p first check symbols;

(b) delaying each symbol in said first block and each of the p first check symbols by a respective different delay time to provide a resulting second block of symbols in a second arranging state, each symbol of the resulting second block originating from a respective different first block; and (c) applying the resulting second block of symbols to a second error-correcting encoder to generate q second check symbols, and transmitting said information symbols and said first and second check symbols, such that said first and second check symbols are generated to satisfy a respective parity check matrix, each matrix having s=p=q columns and p and q rows, respectively, wherein p·q<1, of semi-cyclic codes, said delaying putting adjacent symbols of said first arranging state into uniformly-spaced instances of said second arranging state, wherein said q second check symbols are retro-coupled into said first error-correcting encoder in accordance with said first arranging state, and all symbols are protected by first check symbols and by second check symbols, and for transmitting a finite sequence of first blocks, after termination of said finite sequence, presenting a trailing sequence of s+q−1 notional first blocks which include only notional information symbols, generating a trailing sequence of said first and second check symbols by said delaying of step (b) and retrocoupling of step (c) in synchronism with said presenting, and thereafter terminating said generating of check symbols.

2. A method as claimed in claim 1, wherein said trailing sequence of first and second check symbols is overlayed through symbolwise addition to an initial sequence of first and second check symbols at a commencing part of said finite sequence, thereby realizing a cylindrical storage format.

3. A method as claimed in claim 1, including decoding a digital information signal provided with error correction information by receiving a plurality of s+p+q sequence of input symbols, each symbol having a uniform bit length, and each such sequence of symbols occurring in a respective input channel, check words being included in the transmitted signal as a result of encoding to enable correction of erroneous symbols, said method further comprising the steps of:

(d) applying a third block of symbols, one from each input channel and in the first arrangement state, to a first error-correcting decoder for decoding said third block of symbols on the basis of p first check symbols;

(e) delaying each of the s user symbols and each of the q second check symbols in said third block by a respective different delay time to provide a resulting fourth block of symbols according to the second arranging state, each symbol of a fourth block originating from a respective different third block;

(f) applying said fourth block of symbols to a second error-correcting decoder for decoding said fourth block of symbols on the basis of q second check symbols in order to output at least the s decoded user symbols of said fourth block, such that each of said first and second error-correcting decoders applies a parity check matrix of semi-cyclic codes, each matrix having s+p+q columns, but p and q rows, respectively, where p·q>1 and such that said delaying applies to said p first check symbols after decoding and puts adjacent symbols of said first arranging state into uniformly-spaced instances of said second arranging state, so that all symbols are protected by said first and said second check symbols.

4. A method as claimed in claim 3, further comprising a step, executed after said decoding in said second error-correcting decoder of step (c), of delaying all s user symbols, p first check symbols and q second check symbols in order to recreate said first arranging state for the decoding in a third error-correcting decoder according to a same code as used in said first error correcting decoder.

5. A device for decoding a digital information signal provided with error correction information according to the method claimed in claim 3, further comprising:

input means comprising a plurality of s+p+q input channels for receiving, in each one thereof, a symbol from a third block of symbols, a symbol from each input channel, and according to the first arranging state;

a first error-correcting decoder fed by said input means for decoding said third block of symbols on the basis of p first check symbols; and delay means fed by the first error-correcting decoder so as to delay each of the s user symbols and each of the q second check symbols in said third block by respective different delay times in order to provide a resulting fourth block of symbols according to the second arranging state, each symbol of a fourth block originating from a respective different third block;

a second error-correcting decoder fed by said delay means for decoding said fourth block of symbols on the basis of q second check symbols and for outputting at least the s decoder user symbols of said fourth block, such that each of said first and second error-correcting decoders is arranged to apply a parity check matrix of semi-cyclic codes each matrix having s+p+q columns but p and q rows, respectively, wherein p·q>1, said delay means also applies to said p first check symbols after decoding, and puts adjacent symbols of said first arranging state into uniformly-spaced instances of said second arranging state, thereby executing an error protection operation in each of said first and second error-correcting decoder on both said first check symbols and said second check symbols, wherein for receiving a finite sequence of said third blocks stored according to a cylindrical format, the device comprises variation means for rendering the values of p and q variable amongst respective finite sequences of said first blocks while keeping (p+q) constant, and having detection means for detecting an indicator from an actual finite sequence, a detection output of said detection means feeding said variation means.

6. A device as claimed in claim 5, having supplementary output means disposed at an output of said first error-correcting decoder for outputting, under the control of a selected signal, at least the user symbols of a said third block without using any further error-correcting decoder.

7. A device as claimed in claim 5, said variation means being arranged for allowing q=0.

8. A device for decoding a digital information signal provided with error correction information according to the method claimed in claim 3, further comprising:

input means comprising a plurality of s+p+q input channels for receiving, in each one thereof, a symbol from a third block of symbols, a symbol from each input channel, and according to the first arranging state;

a first error-correcting decoder fed by said input means for decoding said third block of symbols on the basis of p first check symbols; and delay means fed by the first error-correcting decoder so as to delay each of the s user symbols and each of the q second check symbols in said third block by respective different delay times in order to provide a resulting fourth block of symbols according to the second arranging state, each symbol of a fourth block originating from a respective different third block;

a second error-correcting decoder fed by said delay means for decoding said fourth block of symbols on the basis of q second check symbols and for outputting at least the s decoded user symbols of said fourth block, such that each of said first and second error-correcting decoders is arranged to apply a parity check matrix of semi-cyclic codes each matrix having s+p+q columns but p and q rows, respectively, wherein p·q>1, said delay means also applies to said p first check symbols after decoding, and puts adjacent symbols of said first arranging state into uniformly-spaced instances of said second arranging state, thereby executing an error protection operation in each of said first and second error-correcting decoder on both said first check symbols and said second check symbols, and for receiving a finite sequence of said third blocks stored according to a cylindrical format, said first and second error-correcting decoders are arranged to receive uniform numbers of symbols in their respective arranging states in that said second error-correcting decoder completes, whenever appropriate, fourth blocks by end-around wrapping to one or more initial said third blocks.

9. A data carrier for use as a data source device with a method as claimed in claim 3, said data carrier comprising stringed data words, each data word comprising a sequence of symbols and including first and second check symbols, of a first and a second semi-cyclic code, respectively, said symbols being arranged according to a cross-interleaved format among first and second arranging states pertaining to third and fourth blocks of symbols, respectively, in words for error-correcting decoding, and in that all symbols of either of said third and fourth blocks are error-protected by both said first and said second semi-cyclic codes, and the data contains data organized according to respective sequences of said third blocks stored according to a cylindrical code format, respective sequences having different values of p and q while having (p+q) at a constant value, each such finite sequence having an indicator for signalling an actual value of q.

10. A data carrier as claimed in the claim 9, wherein said data is organized as blocks, each block comprising a plurality of first code words that are interleaved on a symbol basis, a predetermined fraction of a sequence of blocks containing a synchronizing part or an auxiliary information part.

11. A data carrier for use as a data source device with a method as claimed in claim 3, said data carrier comprising stringed data words, each data word comprising a sequence of symbols and including first and second check symbols, of a first and a second semi-cyclic code, respectively, said symbols being arranged according to a cross-interleaved format among first and second arranging states pertaining to third and fourth blocks of symbols, respectively, in words for error-correcting decoding, and in that all symbols of either of said third and fourth blocks are error-protected by both said first and said second semi-cyclic codes, and having a finite sequence of said third blocks for error-correcting decoding, wherein said third blocks and fourth blocks all have uniform numbers of symbols by continuing, whenever appropriate, fourth blocks by end-around wrapping to one or more initial said third blocks.

12. A method for transmitting a digital information signal in the form of a plurality of s sequences of information symbols, each symbol having a uniform bit length and each sequence of symbols occurring in a respective input channel, check symbols being included in the transmitted digital information signal as a result of encoding to enable correction of erroneous symbols caused by transmitting, said method comprising the steps of:

(a) applying a first block of s symbols, one from each input channel of a plurality of input channel, in a first arranging state to a first error correcting encoder to generate p first check symbols;

(b) delaying each symbol in said first block and each of the p first check symbols by a respective different delay time to provide a resulting second block of symbols in a second arranging state, each symbol of the resulting second block originating from a respective different first block; and (c) applying the resulting second block of symbols to a second error-correcting encoder to generate q second check symbols, and transmitting said information symbols and said first and second check symbols, such that said first and second check symbols are generated to satisfy a respective parity check matrix, each matrix having s+p+q columns and p and q rows, respectively, wherein p·q>1, of semi-cyclic codes, said delaying putting adjacent symbols of said first arranging state into uniformly-spaced instances of said second arranging state, wherein said q second check symbols are retro-coupled into said first error-correcting encoder in accordance with said first arranging state, and all symbols are protected by first check symbols and by second check symbols, and for transmitting a finite sequence of first blocks, said first and second error-correcting encoders are activated in an alternating fashion, presenting, after termination of said finite sequence, a trailing sequence of s+q−1 notional first blocks including exclusively notional information symbols, continuing generating a trailing sequence of said first and second check symbols through said delaying of step (b) and the retrooupling of step (c) in synchronism with said presenting, and thereafter terminating said generating, wherein at least part of said trailing sequence is overlayed through symbolwise addition on check symbols generated in synchronism with a commencing part of said first blocks.

13. A method for transmitting a digital information signal in the form of a plurality of s sequences of information symbols, each symbol having a uniform bit length and each sequence of symbols occurring in a respective input channel, check symbols being included in the transmitted digital information signal as a result of encoding to enable correction of erroneous symbols caused by transmitting, said method comprising the steps of:

(a) applying a first block of s symbols, one from each input channel of a plurality of input channels, in a first arranging state to a first error correcting encoder to generate p first check symbols;

(b) delaying each symbol in said first block and each of the p first check symbols by a respective different delay time to provide a resulting second block of symbols in a second arranging state, each symbol of the resulting second block originating from a respective different first block; and (c) applying the resulting second block of symbols to a second error-correcting encoder to generate q second check symbols, and transmitting said information symbols and said first and second check symbols, such that said first and second check symbols are generated to satisfy a respective parity check matrix, each matrix having s+p+q columns and p and q rows, respectively, wherein p·q>1, of semi-cyclic codes, said delaying putting adjacent symbols of said first arranging state into uniformly-spaced instances of said second arranging state, so that said q second check symbols are retro-coupled into said first error-correcting encoder in accordance with said first arranging state, and all symbols are protected by first check symbols and by second check symbols, wherein at predetermined intervals header information is introduced into particular first blocks, and said method for said particular first blocks enhances the number of p check symbols through complementary diminishing of the number of s information symbols.

14. A device for transmitting a digital information signal in the form of a plurality of s sequences of information symbols, each symbol having a uniform bit length and each such sequence of symbols occurring in a respective input channel, check words being included in the transmitted signal as a result of encoding to enable correction of erroneous symbols caused by said transmitting, said device comprising:

input means having a first plurality of s input channels for receiving a first block of symbols, one in each input channel, and having a first arranging state;

a first error correcting encoder fed by said first plurality of channels and arranged to generate therein p first check symbols;

delaying means fed by said first error correcting encoder in order to delay each symbol in said first block and each of the p first check symbols by a respective different delay time so as to provide a resulting second block of symbols in a second arranging state on s+p channels, each symbol of a second block originating from a respective different first block;

a second error-correcting encoder fed by said s+p channels for receiving said second block of symbols and arranged to generate q second check symbols;

transmission means for transmitting said q second check symbols together with said second block of symbols, such that said first and second error correcting encoder are arranged to implement check symbols according to a respective parity check matrix, each of which has s+p+q columns, but p and q rows of semi-cyclic codes, respectively, where p·q>1, said delaying means being arranged to put adjacent symbols of said first arranging state and associated first check symbols into uniformly-spaced instances of said second arranging state, and having retrocoupling delay means fed by said second error-correcting encoder in order to feed said q second check symbols back into said first error-correcting encoder in accordance with said first arranging state, all symbols being protected by the first check symbols and by the second check symbols, wherein for transmitting a finite sequence of first blocks, after termination of said finite sequence, said first and second error-correcting encoders presenting a trailing sequence of s+p−1 notional first blocks which include only notional information symbols, and continue to generate a trailing sequence of said first and second check symbols by said delay means and retrocoupling delay means in synchronism with said presenting, and thereafter terminating the generation of check symbols.

15. A device as claimed in claim 14, further comprising overlay means for overlaying, upon generating said trailing sequence of first second check symbols, said trailing sequence by symbol-wise addition to an initial sequence of first and second check symbols at a commencing part of said finite sequence, so that said transmission means realize a cylindrical storage format.

16. A device as claimed in claim 14, further comprising interleave means for effecting, after encoding and before transmission, a uniform interleaving delay between odd channels and even channels.

17. A device for transmitting a digital information signal in the form of a plurality of s sequences of information symbols, each symbol having a uniform bit length and each such sequence of symbols occurring in a respective input channel, check words being included in the transmitted signal as a result of encoding to enable correction of erroneous symbols caused by said transmitting, said device comprising:

input means having a first plurality of s input channels for receiving a first block of symbols, one in each input channel, and having a first arranging state;

a first error correcting encoder fed by said first plurality of channels and arranged to generate therein p first check symbols;

delaying means fed by said first error correcting encoder in order to delay each symbol in said first block and each of the p first check symbols by a respective different delay time so as to provide a resulting second block of symbols in a second arranging state on s+p channels, each symbol of a second block originating from a respective different first block;

a second error-correcting encoder fed by said s+p channels for receiving said second block of symbols and arranged to generate q second check symbols;

transmission means for transmitting said q second check symbols together with said second block symbols, such that said first and second error correcting encoder are arranged to implement check symbols according to a respective parity check matrix, each of which has s+p+q columns, but p and q rows of semi-cyclic codes, respectively, where p·q>1, said delaying means being arranged to put adjacent symbols of said first arranging state and associated first check symbols into uniformly-spaced instances of said second arranging state, and having retrocoupling delay means fed by said second error-correcting encoder in order to feed said q second check symbols back into said first error-correcting encoder in accordance with said first arranging state, all symbols being protected by the first check symbols and by the second check symbols, wherein for transmitting a finite sequence of said first blocks, said first and second error-correcting encoders are alternately activated, and after termination of said finite sequence presenting a trailing sequence of s+q−1 notional first blocks including only notional information symbols and generating a trailing sequence of said first and second check symbols by said delaying means and retrocoupling delay means in synchronism with said presenting, and thereafter terminating the generation of check symbols.

18. A device for transmitting a digital information signal in the form of a plurality of s sequences of information symbols, each symbol having a uniform bit length and each such sequence of symbols occurring in a respective input channel, check words being included in the transmitted signal as a result of encoding to enable correction of erroneous symbols caused by said transmitting, said device comprising:

input means having a first plurality of s input channels for receiving a first block of symbols, one in each input channel, and having a first arranging state;

a first error correcting encoder fed by said first plurality of channels and arranged to generate therein p first check symbols delaying means fed by said first error correcting encoder in order to delay each symbol in said first block and each of the p first check symbols by a respective different delay time so as to provide a resulting second block of symbols in a second arranging state on s+p channels, each symbol of a second block originating from a respective different first block;

a second error-correcting encoder fed by said s+p channels for receiving said second block of symbols and arranged to generate q second check symbols;

transmission means for transmitting said q second check symbols together with said second block of symbols, such that said first and second error correcting encoder are arranged to implement check symbols according to a respective parity check matrix, each of which has s+p+q columns, but p and q rows of semi-cyclic codes, respectively, where p·q>1, said delaying means being arranged to put adjacent symbols of said first arranging state and associated first check symbols into uniformly-spaced instances of said second arranging state, and having retrocoupling delay means fed by said second error-correcting encoder in order to feed said q second check symbols back into said first error-correcting encoder in accordance with said first arranging state, all symbols being protected by the first check symbols and by the second check symbols, wherein at predetermined intervals, header information is contained in particular first blocks, said first error-correcting encoder being arranged for enhancing with respect to such particular first blocks, the number of p check symbols by complementary diminishing of the number of s information symbols.

19. A device for transmitting a digital information signal in the form of a plurality of s sequences of information symbols, each symbol having a uniform bit length and each such sequence of symbols occurring in a respective input channel, check words being included in the transmitted signal as a result of encoding to enable correction of erroneous symbols caused by said transmitting, said device comprising:

input means having a first plurality of s input channels for receiving a first block of symbols, one in each input channel, and having a first arranging state;

a first error correcting encoder fed by said first plurality of channels and arranged to generate therein p first check symbols delaying means fed by said first error correcting encoder in order to delay each symbol in said first block and each of the p first check symbols by a respective different delay time so as to provide a resulting second block of symbols in a second arranging state on s+p channels, each symbol of a second block originating from a respective different first block;

a second error-correcting encoder fed by said s+p channels for receiving said second block of symbols and arranged to generate q second check symbols;

transmission means for transmitting said q second check symbols together with said second block of symbols, such that said first and second error correcting encoder are arranged to implement check symbols according to a respective parity check matrix, each of which has s+p+q columns, but p and q rows of semi-cyclic codes, respectively, where p·q>1, said delaying means being arranged to put adjacent symbols of said first arranging state and associated first check symbols into uniformly-spaced instances of said second arranging state, and having retrocoupling delay means fed by said second error-correcting encoder in order to feed said q second check symbols back into said first error-correcting encoder in accordance with said first arranging state, all symbols being protected by the first check symbols and by the second check symbols, and further comprising variation means for rendering values of p and q variable for respective finite sequences of said first blocks, keeping (p+q) constant.

20. A device as claimed in claim 19, arranged for allowing q=0.

21. A device as claimed in claim 20, further comprising second delay means fed by said second error-correcting decoder in order to delay all a user symbols and p first check symbols and q second check symbols so as to recreate said first arranging state, and a third error-correcting decoder for decoding according to the same code as used in said first error-correcting decoder.

* * * * *